United States Patent [19]

Scifres et al.

[11] Patent Number: 5,231,642
[45] Date of Patent: Jul. 27, 1993

[54] SEMICONDUCTOR RING AND FOLDED CAVITY LASERS

[75] Inventors: Donald R. Scifres, San Jose; Kenneth M. Dzurko, Santa Clara; Robert G. Waarts, Palo Alto; David F. Welch, San Jose; Amos Hardy, Mountain View; Stephen O'Brien, Sunnyvale, all of Calif.

[73] Assignee: Spectra Diode Laboratories, Inc., San Jose, Calif.

[21] Appl. No.: 880,681

[22] Filed: May 8, 1992

[51] Int. Cl.$^5$ .............................................. H01S 3/19
[52] U.S. Cl. ..................................... 372/45; 372/94; 372/93; 372/99; 372/102; 372/46; 372/50; 372/96; 372/20; 372/49; 372/97
[58] Field of Search ............... 372/94, 93, 99, 92, 372/45, 46, 50, 96, 20, 32, 49, 44, 97

[56] References Cited

U.S. PATENT DOCUMENTS

| | | | |
|---|---|---|---|
| 3,969,686 | 7/1976 | Scifres et al. | 331/94.5 H |
| 4,112,389 | 9/1978 | Streifer et al. | 331/94.5 H |
| 4,272,158 | 6/1981 | Johnston, Jr. et al. | 350/375 |
| 4,405,236 | 9/1983 | Mitsuhashi et al. | 356/350 |
| 4,578,793 | 3/1986 | Kane et al. | 372/94 |
| 4,580,269 | 4/1986 | Salour et al. | 372/94 |
| 4,658,403 | 4/1987 | Takiguchi et al. | 372/96 |
| 4,792,962 | 12/1988 | Miyauchi et al. | 372/94 |
| 4,823,357 | 4/1989 | Casey | 372/92 |
| 4,829,537 | 5/1989 | Baer | 372/66 |
| 4,870,654 | 9/1989 | Cantoni et al. | 372/94 |
| 4,896,327 | 1/1990 | Ebberg | 372/32 |
| 4,924,476 | 5/1990 | Behfar-Rad et al. | 372/94 |
| 4,979,178 | 12/1990 | Beausoleil et al. | 372/20 |
| 4,986,661 | 1/1991 | Vick | 356/350 |
| 5,003,550 | 3/1991 | Welch et al. | 372/50 |
| 5,004,342 | 4/1991 | Bernard et al. | 356/350 |
| 5,031,190 | 7/1991 | Behfar-Rad . | |
| 5,088,105 | 2/1992 | Scifres et al. | 372/50 |
| 5,103,456 | 4/1992 | Scifres et al. | 372/50 |

FOREIGN PATENT DOCUMENTS 0208281  9/1986  Japan .................................... 372/96

OTHER PUBLICATIONS

S. Wang et al., "Two-dimensional distributed-feedback lasers and their applications", *Applied Physics Letters*, vol. 22, No. 9, May 1 1973, pp. 460-462.

(List continued on next page.)

*Primary Examiner*—Georgia Y. Epps
*Attorney, Agent, or Firm*—Schneck & McHugh

[57] ABSTRACT

A semiconductor laser that includes at least one grating reflector with a grating period selected to diffract at a nonperpendicular angle within the plane of the laser waveguide. This allows dispersal of laser light, eliminating filamentary multimode operation of broad area lasers. In one embodiment, the grating reflector couples light between a single transverse mode waveguide portion of the optical cavity and a second, broad area, portion that is not collinear with the single mode waveguide. In another embodiment, the cavity favors a ring mode of oscillation. One or more grating reflectors form part of the feedback mechanism which forms a resonant optical cavity with noncollinear portions. Other reflectors in the feedback mechanism include facet reflectors which can be cleaved or ion milled, or semiconductor material refractive index boundaries. Laser embodiments with two or more grating reflectors can be independently tuned to provide a high rate of amplitude modulation. Spatial beam deflection and wavelength tuning are also achieved. A stable unidirectional ring laser is also described. Multiple ring laser cavities can also be coupled together by partially reflecting grating reflectors to form a laser array.

104 Claims, 15 Drawing Sheets

OTHER PUBLICATIONS

T. Kawamura et al., "Optically Pumped GaAs Lasers with Two-Dimensional Bragg Reflectors", *IEEE Journal of Quantum Electronics*, vol. QE-13, No. 10, Oct. 1977, pp. 806-807.

K. Uomi, et al., "Two-Dimensionally Collimated Output Beam from GaAlAs Diode Lasers with Two-Dimensional Distributed Bragg Reflectors", *Japanese Journal of Applied Physics*, vol. 22, No. 5, May, 1983, pp. L267-L269.

S. Wang et al., "Analysis of ring distributed feedback lasers", *Journal of Applied Physics*, vol. 45, No. 9, Sep., 1974 pp. 3978-3980.

W-T Tsang et al., "A Thin-Film Ring Distributed Feedback Laser" date and place of publication not known.

D. R. Scifres et al., "Grating-coupled GaAs single heterostructure ring laser", *Applied Physics Letters*, vol. 28, No. 11, Jun. 1, 1976, pp. 681-683.

C. Elachi, "Waves in Active and Passive Periodic Structures: A Review", *Proceedings of the IEEE*, vol. 64, No. 12, Dec. 1976, pp. 1666-1698.

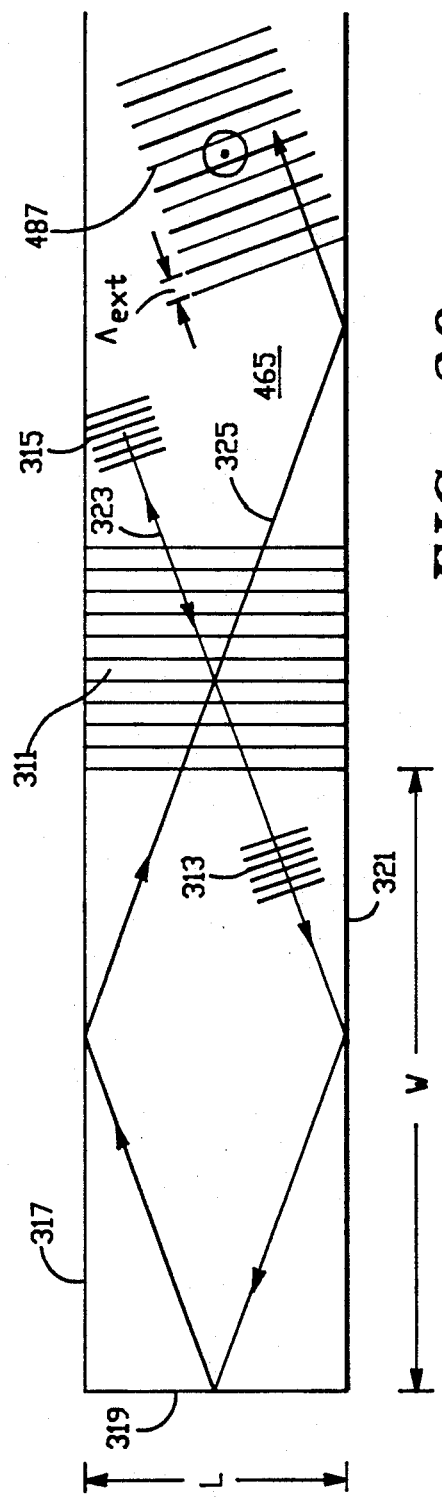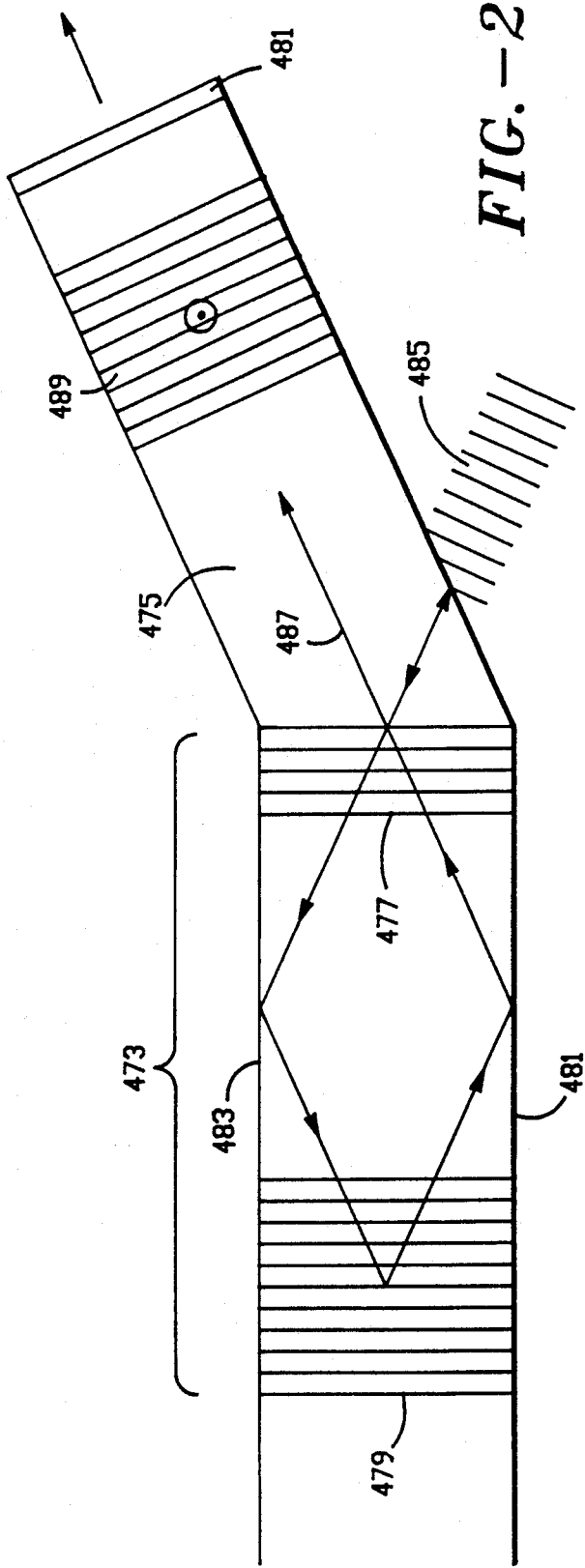

SEMICONDUCTOR RING AND FOLDED CAVITY LASERS

Statement as to Rights to Inventions made under Federally sponsored Research and Development.

This invention was made with government support under Contract No. F29601-91-C-0012 awarded by the Department of the Air Force. The government has certain rights in the invention.

TECHNICAL FIELD

The present invention relates to semiconductor diode lasers, especially broad area lasers. The invention also relates to lasers that are characterized by having a resonant cavity in a ring or folded configuration.

BACKGROUND ART

Semiconductor diode lasers with broad area active regions often produce multiple independent light filaments in the laser cavity. Such filaments are formed as the light builds up in the laser cavity. That is, in ordinary broad area lasers, the light path comes back directly over its prior path. As the light intensity along this path increases, the free carrier density at the center of the filament is somewhat decreased. This decrease in charge density causes an increase in the refractive index at the center of the mode, thereby leading to a stable waveguide for the filament. Unfortunately, each filament is stable within itself and is not coherent with other regions of the broad area laser. Therefore, any broad area laser which laser with multiple independent filaments is incoherent and multimode.

In U.S. Pat. No. 3,969,686, Scifres et al. describe a diode laser in which all four sides of the semiconductor material are cleaved to provide a low loss, totally internally reflecting light path within the active medium of the laser. In order to control which portions of the active medium lase so as to control the path that the totally internally reflected light travels, striped current confinement geometries are used to restrict gain to two spaced parallel elongated regions at 45° to the cleaved surfaces. A periodic structure within the laser having a plurality of parallel teeth is oriented such that the teeth are perpendicular to two sections of the light path, thereby providing distributed feedback for coherent light amplification. The teeth make a 45° angle to the cleaved surfaces. The teeth of the periodic structure are spaced an integer number of wavelengths apart, so that they provide two parallel output beams which are perpendicular to the plane of the pn junction.

In U.S. Pat. No. 4,112,389, Streifer et al. describe a diode laser having an active region with a ring-shaped section and a coupler section coupled to a waveguide. The laser will oscillate at a wavelength $\lambda$ that corresponds to a path length around the ring of $p\lambda + \lambda/2$, where p is an integer, since, at such a wavelength, a lightwave beginning at the coupler section and traveling in either direction around the ring will be 180° out-of-phase with a lightwave that has not yet circulated around the ring and will destructively interfere so that transmission through the coupler section into the waveguide is at a minimum. The degree of coupler symmetry in a given design may be chosen to provide the desired amount of coupling to the waveguide. Semiconductor material is absent above the substrate in all areas not corresponding to the ring-shaped section, coupler section or waveguide, in order to produce mesa-type waveguiding in the active region.

In U.S. Pat. No. 4,792,962, Miyauchi et al. describe a semiconductor laser having a square-shaped optical waveguide with diagonal reflecting mirrors at each of the four corners of the optical waveguide formed from the four cleaved facets of the semiconductor device. A curved waveguide is disposed adjacent to one of the four sides of the square-shaped waveguide for releasing light by means of evanescent optical coupling from the ring-shaped resonant cavity constituted by the square-shaped waveguide. The ends of curved waveguide intersect two of the facets at approximately right angles, through which the laser light is output.

In U.S. Pat. No. 4,924,476, Behfar-Rad et al. describe a semiconductor ring laser having a triangular cavity with three longitudinal cavity sections integrally formed on a substrate, the three sections being joined at their ends to form three apices at which light reflective facets are positioned. Two of the facets are oriented to provide total internal reflection, while the third has a preselected angle for incident light which is less than the critical angle for total internal reflection, so that it is partially transmissive. The preselected angle determines that facet's reflectivity. Facets are formed through the use of chemically assisted ion beam etching.

In the article "Two-dimensional distributed-feedback lasers and their applications" in *Applied Physics Letters.*, vol. 22, no. 9, 1 May 1973, pp. 460-462, S. Wang et al. describe a laser waveguide structure applicable to semiconductor lasers and dye-impregnated thin-film lasers in which the thickness of the waveguide structure varies periodically in two directions. That is, a two-dimensional grating is formed adjacent to the waveguide layer or film to form a two-dimensional distributed-feedback laser. The authors note that one characteristic of such a laser is that the output will show multiple modes oscillating simultaneously, because of the availability of many reciprocal-lattice vectors corresponding to the periodic grating structure on the waveguide. Each laser mode shows a very narrow spectral width and a sharply defined direction.

In the article "Optically Pumped GaAs Lasers with Two-Dimensional Bragg Reflectors" in *IEEE Journal of Quantum Electronics*, vol. QE-13, no. 10, Oct. 1977, pp. 806-807, T. Kawamura et al. describe a two-dimensional distributed-feedback laser in which a two-dimensional ring mode and a one-dimensional DBR mode oscillated simultaneously, because of the availability of several reciprocal lattice vectors corresponding to the periodic grating structures within the gain bandwidth of the lasing medium.

Objects of the present invention include:
(1) providing a broad area semiconductor laser in which mutually incoherent light filaments are prevented from developing in the laser cavity, whereby the laser operates in a stable nonfilamentary mode and emits a coherent output beam;
(2) providing broad area lasers capable of operating in a single transverse mode, a single longitudinal mode (single frequency) or both, even at high output power levels;
(3) providing wavelength tunable, broad area lasers;
(4) providing semiconductor ring lasers having a unidirectional ring mode;
(5) providing lasers which can be amplitude or frequency modulated at high speed and with low power consumption;

(6) providing lasers with a steerable output beam;
(7) providing master oscillator power amplifier (MOPA) devices, based on any of the aforementioned broad area laser oscillators, that emit a coherent output beam; and
(8) providing a low divergence (less than 1° by 1°), grating coupled surface emitter based on any of the aforementioned lasers or MOPA devices.

DISCLOSURE OF THE INVENTION

The above objects have been met with semiconductor lasers that include at least one periodic reflector having partial reflections at several interfaces, such as a grating reflector, and in which the reflector period is selected to diffract only those lightwaves generated by the active region of the laser which are incident upon the periodic reflector at a specific nonperpendicular angle. The periodic reflector causes the light to be spread and coupled out of each filament and across a broad area section of the laser, eliminating the filaments that build up in conventional lasers when light travels back and forth over an identical path with no means for coupling light from one filament into other regions.

In one embodiment, a single transverse mode of oscillation for the lightwaves is selected by a single mode waveguide in a first section of the resonant optical cavity and the grating reflector functions to couple light between this waveguide and a second section of the resonant optical cavity, preferably a broad area section, that is not collinear with the first section. The grating forms part of the noncollinear or "folded" resonant optical cavity, redirecting the light within the cavity. Further, the grating reflector's characteristic tuning for angled reflection causes the cavity to oscillate in the particular longitudinal mode or frequency that results in coupling from one cavity section to the other. Alternate light paths that would allow the buildup of filamentary oscillation within possible collinear cavities in the laser are made lossy relative to the preferred folded light path mode, so that no collinear cavity can oscillate.

In another embodiment, the laser includes two or more grating or dielectric stack reflectors with grating or layer periods selected to periodically reflect laser lightwaves that are incident at a nonperpendicular angle. Any remaining cavity reflectors are non-grating reflectors, such as ion milled or cleaved facets or a refractive index boundary, which are preferably totally internally reflective or highly reflective of the lightwaves in the laser optical cavity. In this embodiment, the periodic reflectors form part of the feedback mechanism that defines the resonant optical cavity, so that the reflectors' characteristic periods cause the cavity to favor a noncollinear mode of oscillation. Unlike prior ring lasers that use only cleaved or etched facets, and which therefore require some form of waveguiding to define the particular light path or folded mode, the lasers with two or more periodic reflectors are tuned for angled diffraction using the specific angle and wavelength response of the periodic reflectors to select one possible ring mode for oscillation. They can therefore employ the entire active region area for providing gain. Possible collinear light paths are made lossy relative to the desired ring light path.

In yet another embodiment, the two or more periodic reflectors form orthogonal sets of gratings. In the special case of orthogonal sets of gratings, lightwaves in the laser are reflected by the grating reflectors when the Bragg conditions:

$$\lambda_0 = 2n_{\it{eff}1}\frac{\Lambda_1}{m_1}\cos\Theta = 2n_{\it{eff}2}\frac{\Lambda_2}{m_2}\sin\Theta$$

$$\text{and } \tan\Theta = \frac{\Lambda_1}{\Lambda_2}\frac{m_2}{m_1}\frac{n_{\it{eff}1}}{n_{\it{eff}2}}$$

are satisfied, where $\lambda_0$ is the free space wavelength of the lightwaves, $n_{\it{eff}1}$ and $n_{\it{eff}2}$ are the effective refractive indices of the laser active medium at the respective gratings, $\Lambda_1$ and $\Lambda_2$ are grating periods for respective sets of grating reflectors, $m_1$ and $m_2$ are integers and $\Theta$ is the incidence angle for lightwaves upon the first set of grating reflectors. It has been discovered that choosing integers $m_1$ and $m_2$ with the lowest possible values consistent with the ability to make short period gratings will cause the possible modes corresponding to different diffraction orders to be sufficiently different in their wavelengths that only one will fall within the spectral gain bandwidth of the active medium. Further, the selected mode will have incidence angles $\Theta$ and $90°-\Theta$ sufficiently different from 0° (perpendicular) that only a noncollinear ring mode will oscillate instead of the collinear 0° DBR mode. Other possible collinear and noncollinear cavity resonances can also be suppressed by the proper choice of grating periods and incidence angles in conjunction with the lasing gain bandwidth. Preferably, all gratings will be located outside of an electrically pumped central gain region. Also preferably, the effective grating periods ($n_{\it{eff}}\Lambda_1$ and $n_{\it{eff}}\Lambda_2$), their orientation with respect to each other and the angles the desired folded light path makes with the gratings will be accurately controlled, thereby increasing the region of coherent coupling.

Unlike prior broad area lasers, which do not operate in a single mode, the grating reflector distributes light among the selected mode's many parallel light paths across the entire broad area of the active region so that the entire laser is coherently locked. Both the distributed nature of the grating's reflection and the broad area coverage of the mode's light paths cause coherent coupling of the light across the entire active region, leading to stable light output without filamentation. For a fixed incidence angle onto the grating reflector, the grating exhibits a narrow spectral bandwidth, thereby discriminating against other wavelengths and their associated transverse modes. Single transverse mode operation is therefore achieved by providing a mechanism to fix the incidence angle of the light with respect to the grating reflector at an oblique angle. In this case, the second grating acts to fix the incident angle.

In another embodiment, a unidirectional ring mode is provided. In a ring laser geometry, wherein light can emerge from a folded ring cavity in two different and separate angular directions, an extra reflector is placed outside the primary cavity to at least partially reflect light emerging in one angular direction back into the cavity. This causes one of the ring directions to experience a lower loss than the other direction, thereby causing only one ring direction to oscillate.

In yet another embodiment, at least one reflector within the folded cavity is electrically tuned, such that either beam steering, amplitude modulation, frequency modulation, or wavelength tuning is achieved.

In yet another embodiment, the nonfilamentary output from the broad area noncollinear laser cavity is fed into an optical power amplifier for yet higher power output and more efficient coherent operation.

In yet another embodiment, the beam from the noncollinear cavity is emitted by means of a detuned grating from the laser surface in a highly collimated output beam.

BRIEF DESCRIPTION OF THE DRAWINGS

FIGS. 14-21 and 24 are top plan views of semiconductor ring laser embodiments of the present invention. The structures in FIGS. 17 and 19-21 also feature mechanism for providing unidirectional ring mode oscillation in laser cavity.

FIGS. 26 and 27 are top plan views of MOPA devices employing ring laser oscillators of the present invention.

BEST MODE FOR CARRYING OUT THE INVENTION

Figure 1:
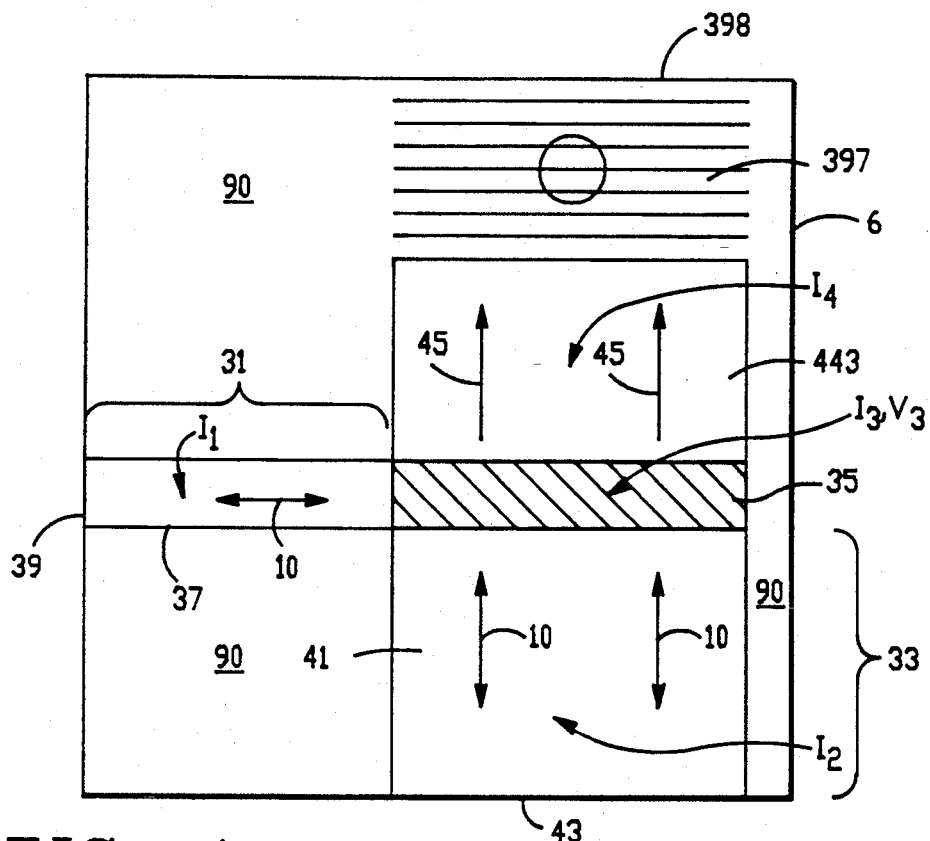
FIGS. 1 and 2 are top plan views of two folded cavity semiconductor laser oscillator structures of the present invention, each with an angled grating for folding the optical cavity of the laser, and combined with an optical power amplifier to form MOPA devices.

Each of the semiconductor ring and folded cavity lasers, laser arrays and MOPAs of the present invention has a semiconductor material body with an active light emitting region near a pn junction in the body and with electrodes on top and bottom surfaces of the body for providing a forward electrical bias across the pn junction and injecting electrical current higher than a lasing threshold current density through the active light emitting region. Alternatively, the structure may be optically pumped, possibly in a configuration lacking a pn junction, in similar fashion to well known optically pumped semiconductor lasers. Lightwaves are thus generated and propagate in the active light emitting region. As is well known, the semiconductor material body can be formed with a homostructure, single heterostructure or, preferably, a double heterostructure. The active region may be a single active layer, a single quantum well structure or a multiple quantum well (MQW) structure. Strained-layer superlattice structures can be used. Typically, the material composition is some combination of III-V compound semiconductors, such as GaAs/AlGaAs or InP/InGaAsP. However, other direct bandgap semiconductor materials may also be used. The laser structure, as described thus far, is completely conventional, encompassing all manner of known diode lasers.

Each of the semiconductor ring and folded cavity lasers, laser arrays and MOPAs of the present invention also has at least one periodic reflector, such as a grating or dielectric stack formed in the semiconductor material body. Gratings may be formed between two adjacent semiconductor layers of differing refractive indices or at an air-semiconductor interface on a surface of the body. Such gratings should be sufficiently close to the active light emitting region to interact with lightwaves propagating in the active region and neighboring layers. The degree of optical lightwave overlap, $\Gamma g$, with the grating partially determines the effective reflectivity of the grating. Deeper grating teeth generally have higher reflectivity. Periodic gratings have a wavelength reflection response that satisfies the Bragg condition $2\Lambda \cos \Theta = m\lambda_0/n_{eff}$, where $\Lambda$ is the tooth spacing or "pitch" of the grating, $\Theta$ is the incidence angle that lightwaves make with respect to the normal to the grating teeth, m is an integer representing the diffraction order, $\lambda_0$ is the free space wavelength of the lightwaves and $n_{eff}$ is the effective refractive index in the grating region. Lightwaves impinging on a grating at an angle also generally reflect light into different polarizations. Thus, the effective grating reflectivity within a lasing cavity is dependent on wavelength, angle of incidence, optical overlap of the lightwave with the grating and the polarization of the incident light. The gratings can be pumped with electrical current to minimize absorption of the lightwaves or to tune the grating's response to incident light. Isolation regions can be made by proton implantation or silicon impurity induced disordering (IID) or other means to separate the different surface contacts. Minimal absorption could also be achieved in the grating regions by a change of composition of the semiconductor material to raise the effective bandgap in those regions by means of IID or other methods of composition change.

Dielectric stacks may be formed on edge surfaces of the semiconductor material body, such as on cleaved or ion milled facets, by coating these surfaces with successive layers of dielectric material. Periodic partial reflections at the layer interfaces of the stack produce a reflection response to the incident light that depends on the thicknesses and refractive indices of the respective layers. Typically, a periodic stack of alternating higher and lower refractive index material layers is formed on the facets in order to create either a low reflectivity or antireflectors (AR) coated light emitting surface or a high reflectivity (HR) coated mirror surface. However, dielectric stacks that exhibit a reflection response to nonperpendicular incident light are also used in embodiments of the present invention. While both gratings and dielectric stacks are well known in the diode laser art and used in many prior lasers, laser arrays and MOPAs, a characteristic of embodiments of the present invention described below is the presence of at least one periodic reflector which is tuned to reflect lightwaves in the laser cavity that are incident on that reflector at a nonperpendicular angle.

With reference to FIG. 1, a laser structure includes a first laser section 31 coupled to a second laser section 33 by a grating reflector 35 that is oriented at a 45° angle to each section and tuned for a right angle reflection of lightwaves from one section into the other. The two laser sections 31 and 33 are therefore noncollinear and the direction of light propagation in the first section 31 is at a right angle to light propagating in the second section 33. The first section 31 has a narrow waveguide 37 supporting only a single spatial mode of propagation. The narrow waveguide 37 in FIG. 1 is bounded at one end by the angled grating reflector 35 and at the other end by a high reflection cleaved or ion milled planar facet 39. Waveguide 37 may also continue into the region occupied by grating 35 in order to avoid spreading of the beam is as it couples into the region of grating 35. The narrow waveguide 37 of the first laser section 31 is electrically pumped by a first drive current $I_1$. The second laser section 33 has a broad area waveguide 41 capable of supporting multiple spatial modes of propagation, but actually supporting only the single spatial mode determined by the narrow waveguide 37 of the first laser section 31. The broad area waveguide 41 in FIG. 1 is bounded at one end by the angled grating reflector 35 and at the other end by a high reflection cleaved or ion milled planar facet 43. The broad area waveguide 41 of the second laser section 33 is electrically pumped by a second drive current $I_2$. ($I_1$ may equal $I_2$.) The optical resonant cavity of the laser oscillator is thus defined between a first reflector 39 and a second reflector 43, and is folded by the angled grating reflector 35. It should be noted that an absorbing region 90 or an AR coating of facet 6, or both (or other means for stopping feedback) should preferably be added in order to avoid collinear reflections that do not depend on the folded cavity formed by grating 35 and mirrors 39 and 43.

In the folded cavity embodiment of FIG. 1, the directions of light propagation within the cavity are contrained by the facet reflectors 39 and 43 in combination with the very narrow reflectivity response of the angled grating reflector 35. This response can be expressed either as an angular bandwidth of a few hundredths of a degree (approximately 0.1 to 1.0 millirad) for a particular wavelength of incident light or as a spectral bandwidth of a few angstroms (approximately 0.1 to 1.0 nanometers, depending on the number of grating teeth interacting with the lightwaves) for a particular incidence angle. Because of this very narrow reflectivity response, only lightwaves that propagate in the waveguides 37 and 41 perpendicular to their respective mirror facets 39 and 43 will couple back and forth between the laser sections 31 and 33, because only those lightwaves will return upon reflection by the facets 39 and 43 to the angled grating reflector 35 at the same angle at which it left the grating reflector and thus be reflected thereby into the waveguide 37 or 41 of the other laser section 31 or 33. The narrow spectral bandwidth for reflection by the grating 35 also means that, with the propagation directions in the folded cavity determined by the orientations of the mirror facets 39 and 43, and thus, with the angle of incidence of light upon the grating 35 also being fixed, the particular frequency of light in the laser cavity that results in reflection by the grating 35 is likewise determined and fixed. The cavity is thus made to oscillate in the particular longitudinal mode that results in maximum coupling (and thus minimum loss) between laser sections 31 and 33. The laser in FIG. 1 is a stable, single longitudinal mode (single frequency) laser.

The laser in FIG. 1 is also a stable, single transverse mode laser. The transverse spatial mode is selected by the narrow waveguide 37 of the first laser section 31, as this waveguide 37 only supports propagation of a single transverse mode. The periodic grating reflector 35 has a width substantially equal to the width of the narrow waveguide 37 and a length substantially equal to the width of the broad area waveguide 41. The periodic grating reflector 35 distributes the light from the narrow waveguide 37 across the entire width of the broad area waveguide 41 in a coherent manner, so that the entire broad area section 33 is phase locked. Likewise, upon reflection of the lightwaves in the broad area waveguide 41 by the mirror facet 43 and the return of the lightwaves to the periodic grating reflector 35, the grating reflector 35 partially reflects the light into the narrow waveguide 37, gathering the light from across the entire width of the broad area waveguide 41 and redirecting it in a coherent manner into the narrow waveguide 37. Thus, the periodic grating reflector 35 causes the light to be spread across the broad area section 33 of the laser cavity and causes the light to be coupled out of any optical filaments that arise in the broad area section 33, thereby eliminating the filamentation that might build up if the light were to travel back and forth in the cavity over an identical path with no means for coupling the light from one filament into other regions. A single transverse mode of oscillation is the result. It should be noted that the angle of grating 35 was chosen at 45°, since facets 39 and 43 were orthogonal to each other. If this were not the case, grating 35 would be oriented at a new angle chosen so that the angle of incidence of lightwaves 10 on grating 35 would equal the angle of reflection of lightwave 10.

The light in the laser cavity may be output either from the first laser section 31 at the mirror facet 39 or from the second laser section at mirror facet 43. However, because light propagating in the broad area waveguide 41 is partially transmitted through the grating 35, due to the grating's narrow width, preferably this transmitted light 45 is used as the laser oscillator's principal output beam. In that case, the mirror facets 39 and 43 are preferably coated for high reflectivity, typically greater than 90%. Output beam 45 can now be amplified by current $I_4$ in section 443. Alternatively, the beam can propagate in a transparent waveguide formed by impurity induced disordering or another method for achieving a transparent waveguide 443. Beam 45 can then be output coupled through a facet 398. Alternatively, output coupling grating 397 can be used. Grating 397 may be reflective of lightwave 45 or detuned. Facet 398 may be reflective or AR coated. Too much reflection from grating 397 or facet 398 may lead to unwanted filamentation. Thus, low reflection or an AR coating is preferred.

Figure 2:
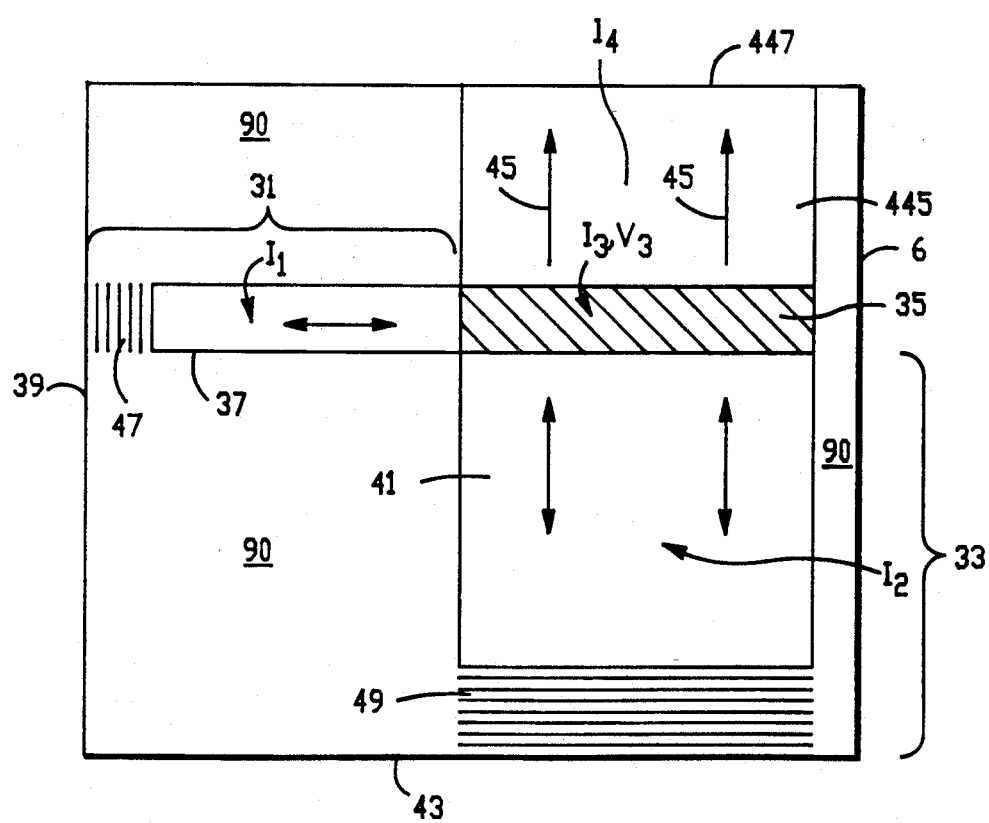

Referring now to FIG. 2, another laser structure also has a folded resonant cavity with noncollinear first and second laser sections 31 and 33 coupled together by a periodic grating reflector 35 oriented with its grating teeth at a 45° angle to each of the sections 31 and 33 for right angle reflection of lightwaves of a particular wavelength between a narrow single transverse mode waveguide 37 and a broad area waveguide 41 in respective laser sections 31 and 33. However, instead of cleaved or ion milled mirror facets like the facets 39 and 43 in FIG. 1, the embodiment in FIG. 2 has distributed Bragg reflector (DBR) gratings 47 and 49 at respective ends of the waveguides 37 and 41 opposite from the angled grating 35. Dielectric stack reflectors could also be used. DBR gratings 47 and 49 have a reflectivity to a particular wavelength of light that depends mainly on the tooth spacing or pitch of the DBR gratings 47 and 49 and on the number of grating teeth. Preferably, the DBR gratings 47 and 49 have peak reflectivity at perpendicular incidence of the same wavelength of light as that for reflection at 45° incidence by the angled grating 35. The reflectivity response of the grating 35 at 45° incidence can be tuned, if necessary, by a reverse bias voltage $V_3$ or injected current $I_3$ to substantially match the reflectivity response of the DBR gratings 47 and 49 at normal incidence. Where DBR gratings 47 and 49 are highly reflective, the light 45 transmitted from the broad area waveguide 41 through the angled grating 35 is used as the laser oscillator's principal output beam. Alternatively, light can be output from the laser cavity through one of the DBR gratings 47 or 49. Note that facets 39 and 43 may be AR coated to enhance the wavelength selectivity of gratings 47 and 49. Alternatively, an absorbing region can be placed between the facets and the gratings to minimize reflection from the facets. Regions 90 and facet 6 serve the same function as in FIG. 1. In defining single mode operation, DBR gratings 47 and 49 serve to fix the wavelength while the waveguide 37 and angled grating 35 serve to fix the incident angle, and thereby, the transverse optical mode. A single DBR grating, either 47 or 49, would also be sufficient to provide preferential wavelength selectivity.

Figure 3:
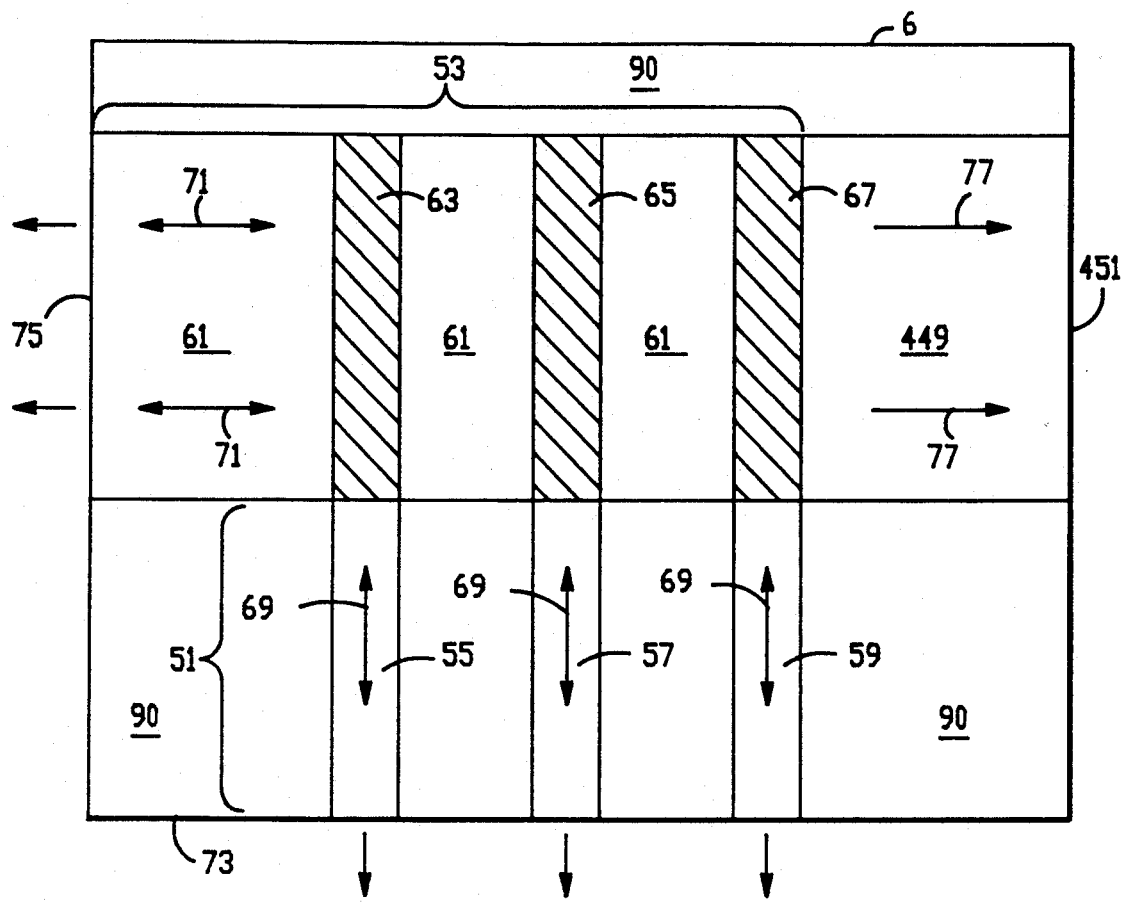
FIG. 3 is a top plan view of a folded cavity laser array device of the present invention.

With reference to FIG. 3, a folded cavity laser array structure includes noncollinear first and second laser sections 51 and 53. The first laser section 51 has a plurality of narrow single transverse mode waveguides 55, 57, 59, etc., each like the waveguide 37 in FIGS. 1 and 2. The second laser section 53 has a single broad area waveguide 61 divided into a like plurality of successive waveguide segments. A plurality of periodic grating reflectors 63, 65, 67, etc. optically couple the respective narrow waveguides 55, 57, 59, etc. of the first laser section 51 to the broad area waveguide 61 of the second laser section 53. Each of the periodic grating reflectors 63, 65, 67, etc. is positioned at an end of a corresponding narrow waveguide 55, 57, 59, etc. and across the entire width of the broad area waveguide 61, dividing the broad area waveguide 61 into successive segments. Each periodic grating reflector 63, 65, 67, etc. is oriented with its grating teeth at a 45° angle to the length of the corresponding narrow waveguide 55, 57, 59, etc. and also at a 45° angle to the length of the broad area waveguide 61. Lightwaves 69 propagating in the narrow single transverse mode waveguides 55, 57, 59, etc. are reflected at right angles by the periodic grating reflectors 63, 65, 67, etc. into the broad area waveguide 61 to provide lightwaves 71 spread in a coherent phase-locked manner across the entire width of the broad area waveguide 61. Likewise, lightwaves 71 are partially reflected by each grating 63, 65, 67, etc. from the broad area waveguide 61 into the plurality of narrow waveguides 55, 57, 59, etc. in the array. Cleaved or ion milled planar facet reflectors 73 and 75 at ends of the narrow waveguides 55, 57, 59, etc. and broad area waveguide 61 combine with the periodic grating reflectors 63, 65, 67, etc. to form the resonant optical cavity for the laser array structure. The propagation direction of light 69 in narrow waveguides 55, 57, 59, etc. and the propagation of light 71 in broad area waveguide 61 are perpendicular to the mirror facets 73 and 75, respectively, because any other direction would not result in a sustainable retracing path of oscillation. As in the embodiments in FIGS. 1 and 2 that have only a single narrow waveguide, a single periodic angled grating reflector and a single broad area waveguide, the laser array embodiment in FIG. 3 prevents light filaments from building up in the broad area portion 53 of resonant cavity by using the periodic grating reflectors 63, 65, 67, etc. to spread the light 69 reflected from the corresponding array of narrow waveguides 55, 57, 59, etc. across the entire width of the single broad area waveguide 61 in a coherent manner.

All of the gratings 63, 65, 67, etc. may be tuned to reflect light at the same wavelength. In this case, some of the light 71 in the broad area waveguide 61 is partially reflected in the first grating 63 into the narrow waveguide 55 and partially transmitted to the second grating 65, where the light is again partially reflected into the narrow waveguide 57 and partially transmitted to the next grating 67, etc. In this way, the entire array 51 of narrow waveguides 55, 57, 59, etc. is phase-locked. Alternatively, each of the gratings 63, 65, 67, etc. may be tuned to reflect a different wavelength of light. In this case, each of the narrow waveguides 55, 57, 59, etc. and corresponding grating reflectors 63, 65, 67, etc., together with the common broad area waveguide 61 and facet reflectors 73 and 75, forms a separate laser resonant cavity tuned to oscillate at a different wavelength of light. The light can be coupled out of the laser oscillator either from the array of narrow waveguides 55, 57, 59, etc. through the facet 73, or from the broad area waveguide 61 through the facet 75. Alternatively, the light 77 transmitted through the last grating 67 in the series at one end of the broad area waveguide 61 may be used to form the output beam. Either or both facet reflectors 73 and 75 can be coated for high reflectivity or low reflectivity, as appropriate.

Figure 4:
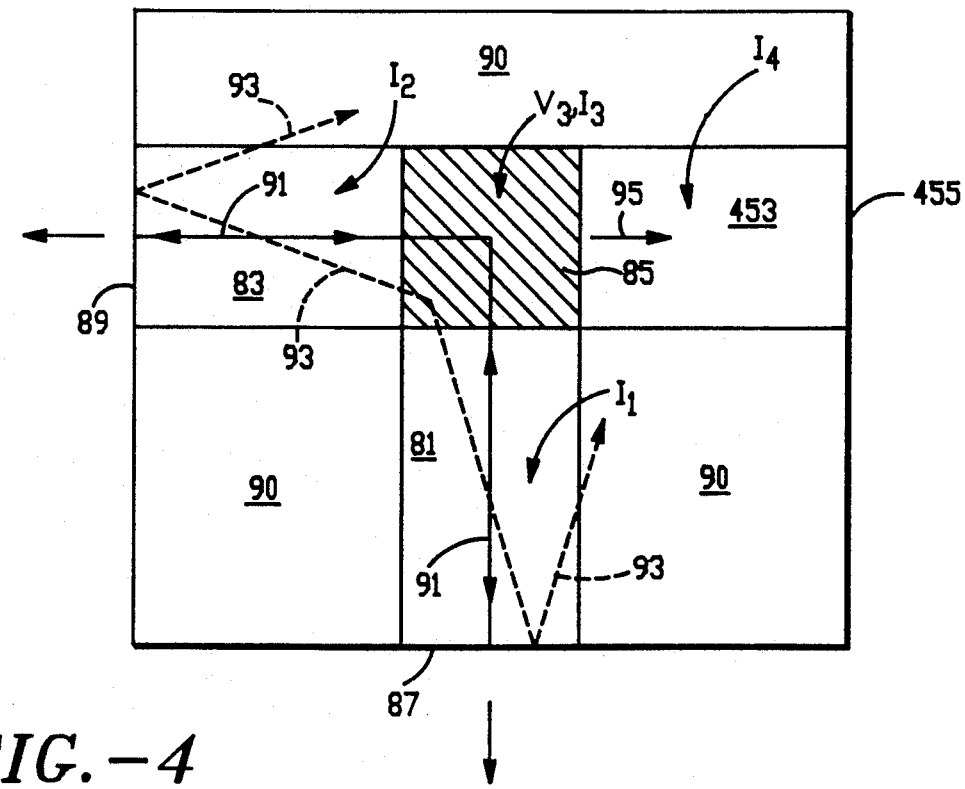
FIGS. 4-9 are top plan views of additional folded cavity laser embodiments of the present invention.

With reference to FIG. 4, a laser structure with a folded cavity may have a pair of broad area cavity sections 81 and 83 coupled to one another by means of a periodic grating reflector 85. At one end of each of the broad area cavity sections 81 and 83, opposite from the end at which the grating reflector 85 is situated, are reflectors 87 and 89, such as cleaved or ion milled facets or DBR gratings. The periodic grating reflector 85 is oriented in FIG. 4 at a 45° angle with respect to reflectors 87 and 89. Broad area cavity sections 81 and 83 and grating reflector 85 may be separately pumped. Unpumped absorbing sections 90 may bound the cavity sections 81 and 83 to avoid unwanted reflections. The laser structure in FIG. 4 is similar to those seen in FIGS. 1 and 2, except that region 81 is a broad area cavity section, instead of a narrow, single transverse mode waveguide.

Like the structures in FIGS. 1 and 2, the reflectors 87 and 89 in FIG. 4 determine and fix the angle of incidence of light onto the periodic grating reflector 85 for lasing action. In order for light to make a round trip in the folded cavity, the light must strike and be reflected by the reflectors 87 and 89 at normal incidence, as represented in FIG. 4 by the solid line light path 91. Any light propagating in the folded cavity that strikes the reflectors 87 and 89 at non-normal incidence, as represented in FIG. 4 by the dashed line path 93, will eventually bounce out of the broad area gain regions 81 and 83, and even if it does remain in the broad area gain regions 81 and 83, will be incident upon the periodic grating reflector 85 at a different angle from that which it first encountered the grating reflector 85, and thus will not be reflected. With the light propagation directions in the folded cavity selected by the orientation of the reflectors 87 and 89, and thus the light incidence angle relative to the grating reflector 85 fixed, the lasing wavelength is uniquely determined by the narrow frequency band of the grating's reflectivity response. Only one longitudinal mode or frequency oscillates. The grating reflector 85 spreads the lightwaves across the entire width of broad area regions 81 and 83, preventing development of stable light filaments. As seen in FIG. 4, the grating 85 is typically shaped as a square to create substantially equal reflection across the broad area regions 81 and 83. However, the shape of the grating 85 would also be tailored to provide a Gaussian or other intensity distribution across the broad area regions 81 and 83, and thereby provide a Gaussian output beam. The output beam may be extracted from either broad area portion 81 or 83 through the corresponding reflector 87 or 89. Alternatively, light 95 that is transmitted from one broad area portion 83 through the periodic grating reflector 85 may be used to form the output beam. An amplifying section 453 pumped by current $I_4$ may be used to further enhance the output beam emitted through facet 455. This facet 455 is preferably AR coated such that reflections between reflectors 89 and 455 do not cause collinear oscillation thereby overriding the folded cavity. One or both of the reflectors 87 and 89, if mirror facets, may be coated to produce near 100% reflectivity. If output is desired from facet 89, for example, facet 87 may be nearly 100% reflecting, while region 453 may be left unpumped, or even reverse biased, so as to be rendered more absorbing.

Figure 5:
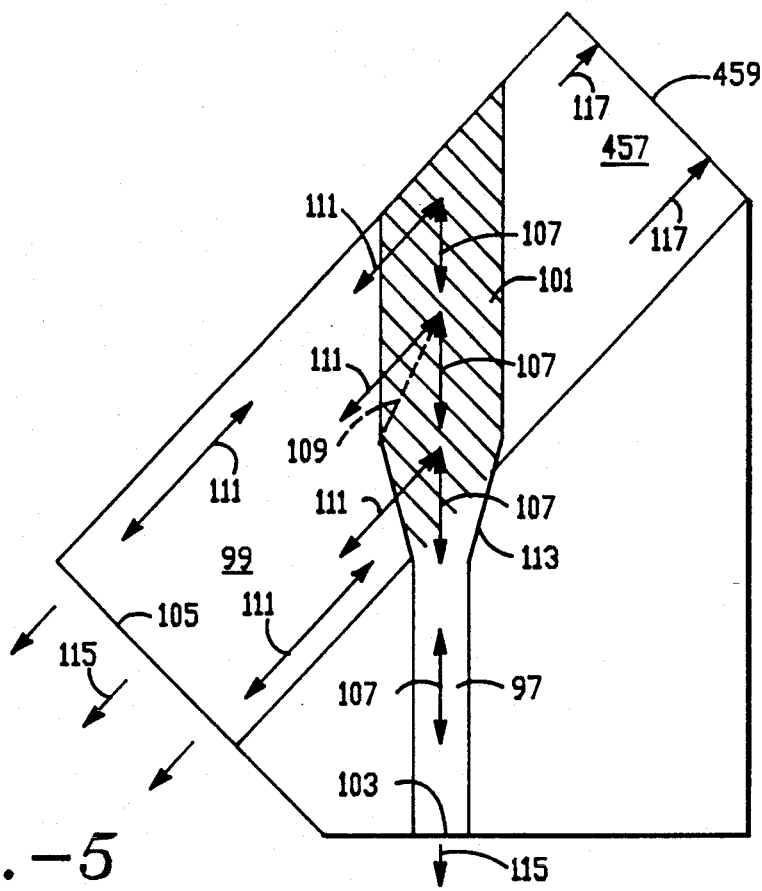

With reference to FIG. 5, another laser structure illustrates that the incidence angle of light upon a periodic grating reflector need not be at 45° relative to the normal to the grating, and further that the light need not be reflected at right angles to couple light from one cavity section to the other. The laser structure in FIG. 5 includes noncollinear first and second laser cavity sections 97 and 99, which in this case are a narrow single transverse mode waveguide 97 and a broad area waveguide 99, and also includes a periodic grating reflector 101 disposed at a common end of the two cavity sections 97 and 99 for coupling light from one section to the other. Reflectors 103 and 105, such as mirror facets or DBR gratings, are disposed at ends of the cavity sections 97 and 99 opposite from the periodic grating reflector 101, and together with the grating reflector 101 define a folded optical cavity within which lightwaves 107 and 111 propagate under lasing conditions. As in the previous embodiments, the light propagation direction in each section 97 and 99 of the folded cavity is perpendicular to the corresponding planar reflector 103 or 105 at the end of that section 97 or 99. However, unlike the embodiments in FIGS. 1-4, the lengths of the waveguides 97 and 99, along which the light propagates, are not at a right angle to one another. Further, the periodic grating reflector 101 in FIG. 5 is oriented with the grating normal 109 at an angle other than 45° with respect to the propagation direction of incident light 107 and 111. Preferably, the grating is oriented such that the angle of incidence of lightwave 107 is equal to its angle of reflection which corresponds to lightwave 111. Accordingly, the light 107 or 111 is reflected from one waveguide 97 or 99 to the other at other than a right angle. While FIG. 5 shows reflection at less than a right angle, the periodic grating 101 may also be oriented to provide reflection at more than a right angle. This variation from the previously disclosed right angle reflection can be applied to any of the laser embodiments. One advantage of this orientation of the periodic grating reflector 101 is that high TE-to-TM mode conversion can be avoided. The relative strength of such conversion peaks at 45° incidence and falls off for larger and smaller incidence angles. The nonperpendicular angle of the length of the broad area portion 99 with respect to the narrow waveguide portion 97 also somewhat increases the path length experienced by lightwaves 111 in the grating 101 to further improve reflection into the waveguide 97. The grating 101 can also be made wider than the narrow waveguide 97 by providing a tapered transition 113 in which the grating reflector 101 gradually expands in width outward from the narrow waveguide 97, like the bell end of the horn, to improve reflection of light 111 in the broad area waveguide 99 into the narrow waveguide 97. The light output beam 115 can be extracted from the narrow waveguide 97 through facet 103, or preferably from broad area waveguide 99 through facet 105. Alternatively, the light 117 that passes through the periodic grating reflector 101 from the broad area portion 99 can be used to form the output beam. Either or both of the reflective facets 103 and 105 may be coated for near 100% reflection. Again, facet 459 is preferably AR coated or angled relative to facet 105 to avoid unwanted reflections that would cause a collinear light path to lase in preference to the folded light path.

Figure 6:
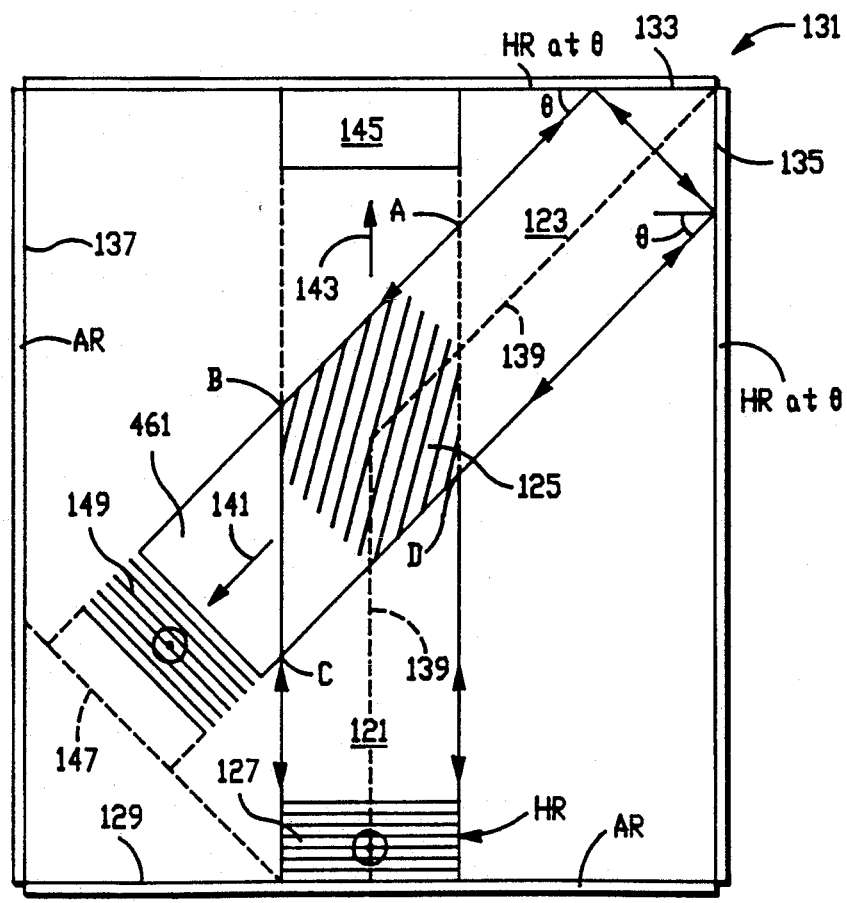

With reference to FIG. 6, a folded cavity laser structure includes noncollinear first and second broad area waveguides 121 and 123 optically coupled together by a periodic grating reflector 125. The incidence angle of light upon the periodic grating reflector 125 in FIG. 6 is greater than 45°. Accordingly, the light is reflected in this embodiment by more than 90°, and the lengths of the two waveguides 121 and 123 and the direction of light propagation in those waveguides 121 and 123 are at an obtuse angle, i.e. greater than 90°, relative to one another. The periodic grating reflector 125 is at one end of each of the waveguides 121 and 123. The other end of the broad area waveguide 121, opposite from the end having the periodic grating reflector 125, has a distributed Bragg reflector (DBR) grating 127. The facet surface 129 adjacent to the DBR grating 127 is antireflection coated to avoid formation of a Fabry-Perot cavity mode within the semiconductor body. The other end of the second broad area waveguide 123, opposite from the end having the periodic grating reflector 125, has a 90° reflective corner 131 formed by the intersection of two cleaved facet reflectors 133 and 135 at right angles. The remaining facet surface 137 of the semiconductor body is preferably antireflection coated to avoid formation of a Fabry-Perot cavity mode. Region 145 may be absorbing to avoid oscillation in a collinear light path.

The use of a corner reflector 131 in the laser structure to form part of the resonant cavity is based on the principle that for a perfect 90° corner, a collimated light beam centered along line 139 and incident at any nonperpendicular angle will, when successively reflected by the corner facets 133 and 135, return along a parallel path, and therefore be incident upon the periodic grating reflector 125 at the same angle at whch it left the grating 125. The actual light propagation direction in the two broad area waveguides 121 and 123 is determined by the orientation of the periodic grating reflector 125 with respect to the first waveguide 121 and the fact that lightwaves reflected by the grating reflector 125 into the first waveguide 121 will return to the grating reflector 125 at the same angle only if it reflects perpendicularly off of the DBR grating 127. A cleaved reflecting facet may also be used in place of grating 127. The grating reflector 125 selects the wavelength of light which will reflect at that angle. Preferably, the DBR grating 127 is highly reflective and has a pitch selected to provide peak reflectivity at the selected wavelength for normal incidence. The laser structure in FIG. 6 allows a choice of grating orientation and pitch based on parameters such as ease of fabrication of the desired grating pitch, diffraction efficiency at the desired incidence angle and desired TE/TM polarization discrimination. The corner 131 should preferably be located such that the intersection of facets 133 and 135 coincide with the center ray of the beam, indicated by dashed line 139. However, if a cleaved reflecting facet is used, replacing grating 127, the need for very high accuracy in the orientation or period of grating 125 is reduced, as the corner 131 reflects all wavelengths incident upon the original path. The only effect is then that the angle $\Theta$ changes with wavelength $\lambda$ which causes the beam to be slightly off center relative to corner 131. This beam would then miss the maximum gain path and would not lase relative to one with a wavelength that hits the center of the corner 131.

Light incident upon either corner facet 133 or 135 will return upon reflection on the opposite side of the waveguide 123, centered about the center ray 139. Thus, light is coupled from one side to the other. Further, the periodic grating reflector 125 oriented for nonperpendicular incidence spreads the light from one waveguide 121 or 123 across the width of the other waveguide 121 or 123. The shape of the periodic reflector grating 125 can be a parallelogram extending over the area bounded by points A,B,C and D that mark the intersection of area of the two obtuse waveguides 121 and 123. Such a shape would allow an equal interaction length for all incident beam paths and also cause spreading of each incident beam across the entire length of the waveguide 121 or 123. Alternatively, the grating 125 may be in the shape of a truncated parallelogram or hexagon, as shown, that provides greater interaction to centrally located beam paths as compared with the edgemost beam paths. Other grating shapes might also be used.

The light in the laser cavity may be output from first broad area waveguide 121 through DBR grating 127, if grating 127 is a surface emitting, second order grating. This is true of any of the normal incidence grating reflectors which are in the cavity. The laser light may also be output through an AR coated facet 129 or from second broad area waveguide 123 by partial transmission of light 141 through the periodic grating reflector 125 to an ion milled facet 147, or to a surface emitting grating 149. Light 143 transmitted through the grating reflector 125 from the first broad area waveguide 121 is directed into a light absorptive or "lossy" region 145, formed, for example, by etching away the active region of the semiconductor body, so as to prevent feedback into the cavity by reflection off of the facet 133. Each of the facet reflectors 133 and 135 forming the reflective corner area 131 may be coated to make them highly reflective at an angle $\Theta$, while being of a low reflectivity for light impinging upon them at normal incidence. Alternatively, or in addition, reflection off of one or both of the facets 133 and 135 may be via total internal reflection.

Figure 7:
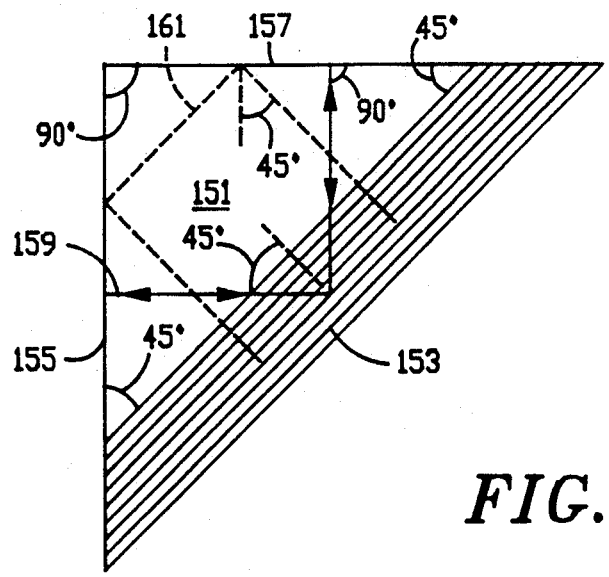

With reference to FIG. 7, another folded cavity laser embodiment has a broad area gain region 151, a periodic reflector 153 and two cleaved or ion milled facet reflectors 155 and 157, which together form a resonant optical cavity. The periodic reflector 153 may be a grating reflector or a dielectric stack reflector. The periodic reflector 153 is oriented in FIG. 7 at a 45° angle with respect to each of the facet reflectors 155 and 157. The facet reflectors 155 and 157 are consequently at a 90° angle to one another. One possible mode of oscillation for the light in the laser cavity has two light propagation directions which are perpendicular to the respective facet reflectors 155 and 157 and at a 45° angle of incidence to the periodic reflector 153. This mode, represented by the light path 159 in FIG. 7, is like the mode that operates in the laser structure of FIG. 4, except that the two noncollinear broad area waveguides 81 and 83 in FIG. 4 are now replaced by a single common broad area gain region 151 for both light propagation directions. Again, the periodic reflector 151 spreads light which is incident at a 45° angle from one propagation direction across an area of the gain region, i.e. over many parallel paths, in the other propagation direction, thereby preventing the buildup of light filaments. Another possible mode of oscillation is represented in FIG. 7 by the dashed path 161. This alternate mode is incident upon and reflected by the periodic reflector 153 at normal incidence and is incident upon and reflected from the facets 155 and 157 at a 45° incidence angle. This is similar to the corner reflection in FIG. 6, except that in FIG. 6 the light is incident upon the grating 125 at a nonperpendicular angle, whereas in FIG. 7, the light 161 is incident upon the periodic reflector 153 at perpendicular incidence. This latter mode does not avoid filamentation. Accordingly, the period of reflector 153 should be selected so that the gain band of the semiconductor laser material peaks near the wavelength reflected by the reflector 153 at 45° incidence, so that the gain for the wavelength reflected by the reflector 153 at normal incidence is significantly lower. Since the two wavelengths differ by about 40%, the criteria is not difficult to accomplish.

Figure 8:
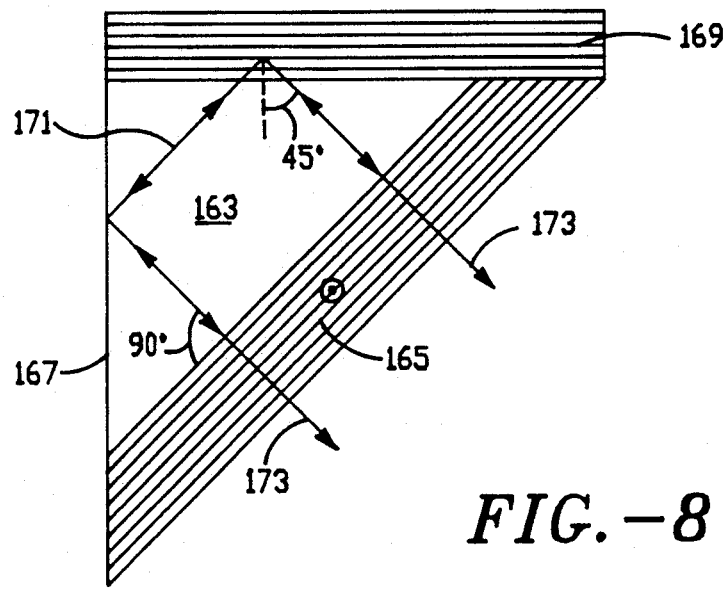

With reference to FIG. 8, a variation of the laser structure of FIG. 7 employs two periodic reflectors 165 and 169 and one facet reflector 167 bounding a broad area gain region 163. Essentially, the facet reflector 157 in FIG. 7 has been replaced by a periodic reflector 169. The periodic reflectors 165 and 169 may be gratings or dielectric stacks. One periodic reflector 165 or 169 is tuned for normal incidence and reflection of a particular wavelength of light, while the other periodic reflector 165 or 169 is tuned for reflection of light of that same particular wavelength at 45° incidence. One periodic reflector 165 offers, in combination with the facet 167, a selection of the two modes available in FIG. 7, and the second periodic reflector 169 selects which of the two modes will oscillate. The presence of at least one periodic reflector 169 that reflects at nonperpendicular incidence causes the coherent partial reflection of lightwaves from one propagation direction to the other propagation direction, that spreads the lightwaves across the broad area gain region 163 and prevents filamentation. Periodic reflector 169 may be a dielectric stack reflector or a grating reflector. The light 173 may be extracted through the periodic reflector 165 that receives normally incident light. Alternatively, periodic reflector 165 may be a second order grating, so that light is diffracted from the laser surface. This results in a highly collimated beam in two dimensions. Diffraction-limited beams having divergence angles of 0.2°×0.2° have been observed.

Figure 9:
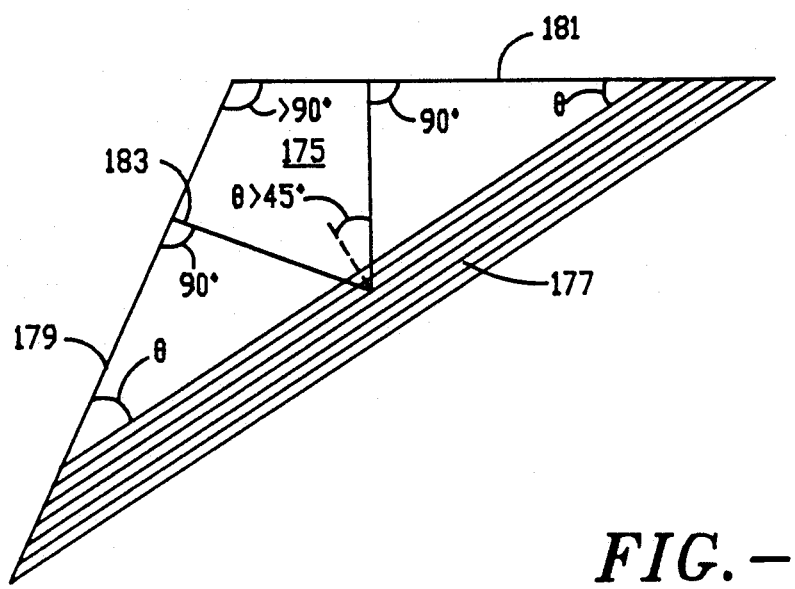

With reference to FIG. 9, another variation of the laser structure of FIG. 7 orients the two facet reflectors 179 and 181 so that they intersect at an angle greater than 90°. As in FIG. 7, the laser structure of FIG. 9 has a broad area gain region 175 bounded by a periodic reflector 177, such as a grating or dielectric stack, and by the two nonperpendicular facet reflectors 179 and 181. Because the facets 179 and 181 are not at right angles to one another, the corner reflection mode represented by path 161 in FIG. 7 is no longer possible. Lightwave paths will close only for the mode of oscillation in which light propagation directions are perpendicular to facets 179 and 181, as represented by path 183. The facet mirrors 179 and 181 can be cleaved or ion milled facets. The periodic reflector 177 is oriented so that incidence and reflection angles are the same for lightwaves propagating perpendicular to both facets 179 and 181, i.e. so that the normal to the periodic reflector 177 bisects the facet intersection or corner angle. The periodic reflector 177 selects the wavelength for which light propagating perpendicular to one of the facets 181 and 179 and incident upon the periodic reflector 177 at an angle Θ (less than 45°) will be reflected. The periodic reflector 177 spreads the light upon reflection, thereby preventing filamentation. The light output can be through the periodic reflector 177, as in FIG. 8, or preferably through one of the facet reflectors 179 and 181. One or both of the facets 179 and 181 can be coated for high reflectivity.

Figure 10:
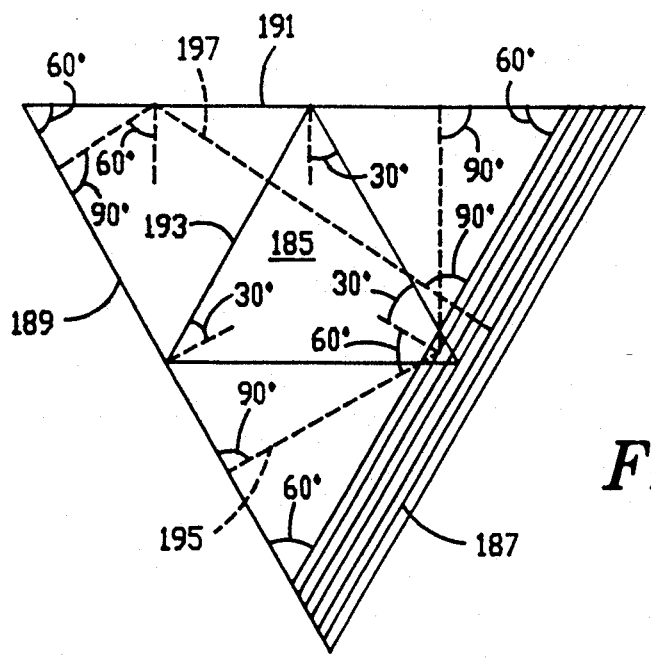
FIGS. 10-12 are top plan views of semiconductor diode laser structures of the present invention that can be constructed to oscillate in a folded cavity mode or constructed to oscillate in a ring mode.

With reference to FIG. 10, yet another variation of the laser structures in FIG. 7 again has a broad area gain region 185 bounded by two facet reflectors 189 and 191 and by a periodic reflector 187, but the facet reflectors 189 and 191 now intersect one another at an angle less than 90°. For example, in the embodiment shown in FIG. 10, the three reflectors 187, 189 and 191 form a 60-60-60 equilateral triangle. Several modes are possible. A first mode of oscillation, represented by dashed path 195, has light propagation at normal incidence to the facet reflectors 189 and 191 and 60° incidence onto the periodic reflector 187. A second mode of oscillation, represented by solid line path 193, is a ring mode that has light incident upon each of the three reflectors 187, 189 and 191 at a 30° angle relative to the perpendicular to the respective reflectors. A third mode, represented by path 197, is perpendicularly incident upon periodic reflector 197, incident at a 60° angle to one facet 189 or 191 and perpendicularly incident upon the other facet 189 or 191. The first mode 195 oscillates at a wavelength, determined by the reflection response of the periodic reflector 187, that is sufficiently far from the wavelengths for the other two modes (73% longer than second mode, twice as long as the third mode) to be selected with a single periodic reflector 187, if the period of the reflector 187 is tuned for 60° incidence reflection near the peak in the gain band of the semiconductor laser material. However, the first mode 195 uses only two-thirds of the gain region 185, the area furthest from the periodic reflector 187 not being reached by any lightwaves in this mode. This region, therefore, need not be pumped. An output beam may be extracted from one of the facets 189 or 191 in this mode 195.

The second mode 193 may also be used. It uses the entire area of the active gain region 185, but oscillates at a wavelength which is only about 15% longer than the wavelength for the third mode 197, near enough so that both the second and third modes 193 and 197 might oscillate at high power if proper care is not exercised in choosing the mode order m and the period in conjunction with the gain bandwidth of the lasing medium.

Figure 11:
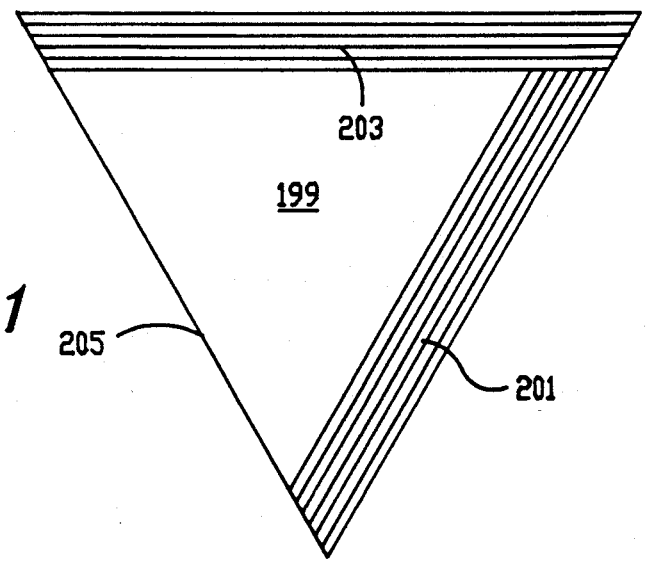
Figure 12:
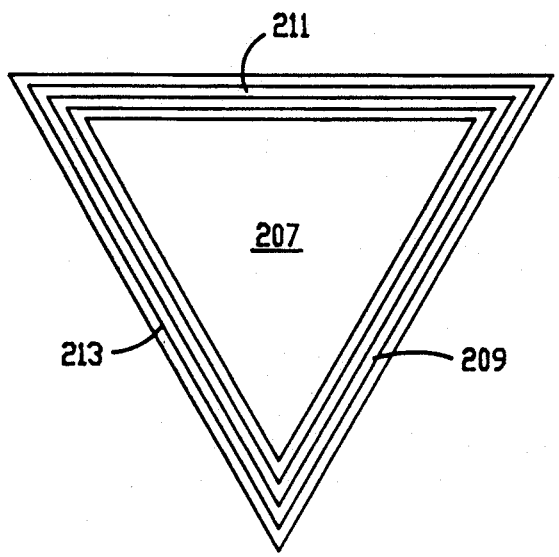

The third mode 197, with its normal incidence upon periodic reflectors 197, tends to filament. Accordingly, in FIG. 11 the broad area gain region 199 is bounded by two periodic reflectors 201 and 203, such as gratings or dielectric stacks, and one cleaved or ion milled facet reflector 205, oriented to form an equilateral 60-60-60 triangle. In FIG. 12, the broad area gain region 207 is bounded by three periodic reflectors 209, 211 and 213 in a 60-60-60 triangular arrangement. The gratings 201 and 203, or 209, 211 and 213 are equally tuned for reflection at 30° incidence from the normal in order to favor the 30° incidence second mode 193.

Figure 13:
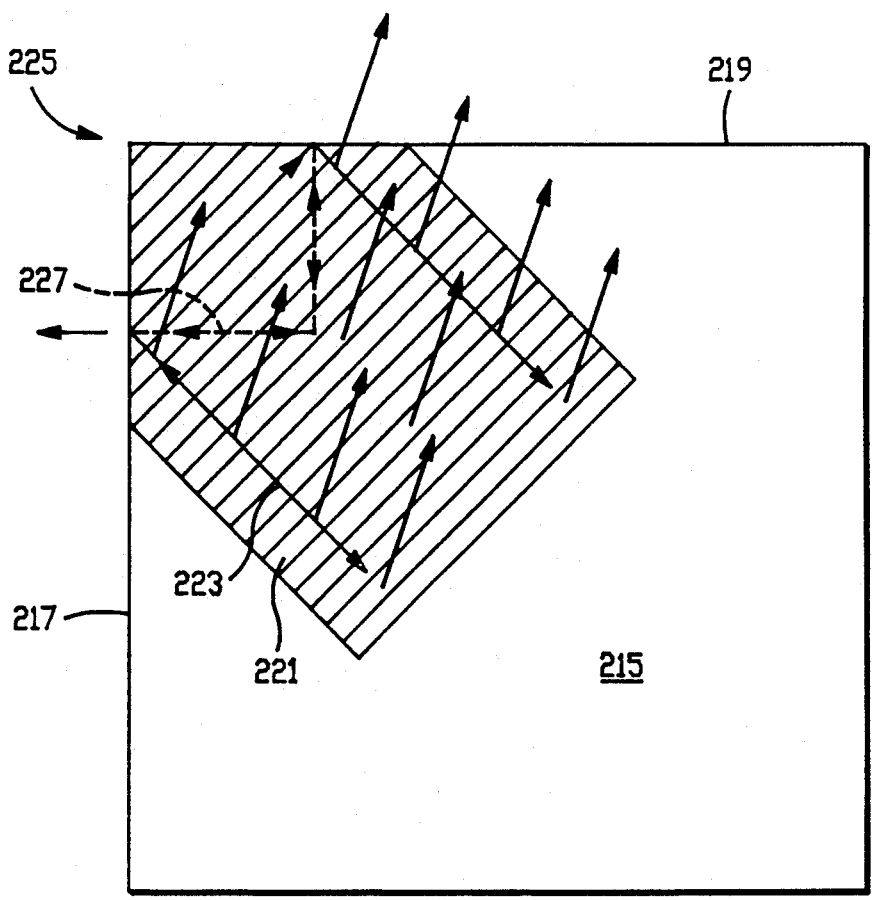
FIG. 13 is a top plan view of a distributed feedback folded cavity laser of the present invention.

With reference to FIG. 13, a semiconductor body 215 may include a pair of adjacent intersecting facet reflectors 217 and 219 at a right angle to one another, and a periodic grating reflector 221 oriented at a 45° angle to each facet 217 and 219. This laser structure is a variant of the laser structure in FIG. 7, in which the grating reflector 221 provides distributed feedback. The grating reflector 221 extends from the corner 225 where the facets 217 and 219 intersect over an area that comprises a broad area gain region of semiconductor body 215. The same two modes that can oscillate in the laser structure of FIG. 7 also can oscillate in this embodiment. The preferred nonfilamentary mode, represented by the dashed path 227, has light propagation perpendicular to the facets 217 and 219, and distributed reflection by the periodic grating 221 at 45° incidence. The laser output beam can be extracted from one of the facets. The mode, represented by path 223, that totally internally reflects off of facets 217 and 219 at 45° incidence and is reflected by the periodic grating 22i at normal incidence is filamentary. The light can be emitted through the top surface of the semiconductor body 215 by the periodic grating 221, if the grating is an even order grating.

Figure 14:
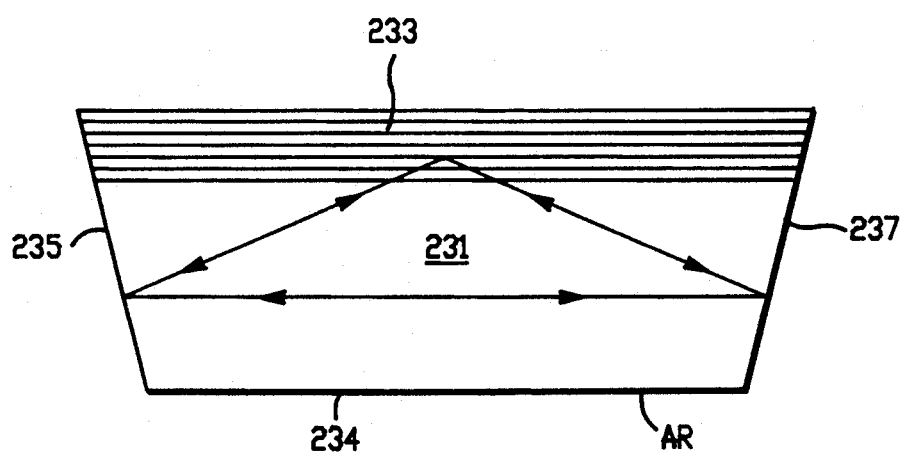

With reference to FIG. 14, a laser structure has an active gain region 231 bounded on three sides by a periodic reflector 233, such as a grating or dielectric stack, tuned for shallow incidence, and two facet reflectors 235 and 237, which are not parallel to one another, but instead converge slowly toward one another away from the periodic reflector 233. Either one or both of the facet reflectors 235 and 237 may be a distributed reflector. The structure is similar to that seen in FIG. 10, except that the angle of intersection for the two facets 235 and 237, if they were to be extended, would be much less than 60°, so that even the ring mode 293 of FIG. 10 would no longer extend over the entire triangular area, and thus the unused end portion of gain region 231 may be truncated or may be unpumped. The end facet 234 created by this truncation is antireflection coated for very low reflectivity. The side facets 235 and 237 may be coated for high reflectivity. Alternatively, one end may be coated for high reflectivity and the other end may be coated for low reflectivity and used as the output coupler. An advantage of the shallow incidence upon periodic reflector 233 is that a large grating pitch can be used, because higher diffraction orders will still efficiently reflect shallow incident light. For a dielectric stack reflector, an advantage is that only a small refractive index change between successive layers is needed for efficient reflection at shallow incidence.

Figure 15:
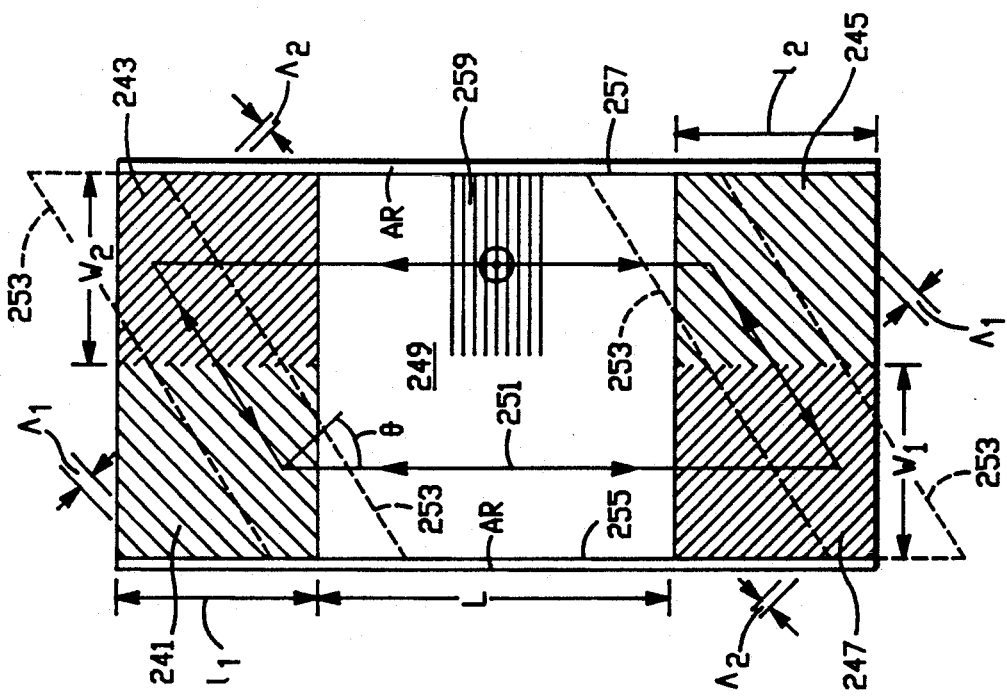

With reference to FIG. 15, a ring oscillator embodiment employs two orthogonal sets of periodic grating reflectors 241, 243, 245 and 247. A first set of grating reflectors 241 and 245 has a first grating pitch $\Lambda_1$ and a first orientation. A second set of grating reflectors 243 and 247 has a second grating pitch $\Lambda_2$ and a second orientation that is perpendicular to the first orientation. A broad area gain region 249 is located between one pair of gratings 241 and 243, one from each set, and another pair of gratings 245 and 247, again one from each set. The grating reflectors 241, 243, 245 and 247 define a resonant optical cavity that favors a ring mode of oscillation, represented by the light path 251.

The directions of propagation of the light 251 in the laser cavity depend on the tuning of the two sets of grating reflectors 241, 243, 245 and 247. Each grating 241 and 245 of the first set has a reflection response that satisfies the Bragg condition: $2 \Lambda_1 \cos \Theta = m_1 \lambda_0 / n_{eff1}$, where $\lambda_1$ is the pitch of gratings 241 and 245, $\Theta$ is the angle of incidence which light 251 makes with respect to the normal to the gratings 241 and 245, $m_1$ is an integer representing the diffraction order, $\lambda_0$ is the free space wavelength of the incident light 251 and $n_{eff1}$ is the effective refractive index in the waveguide area including the gratings 241 and 245. Likewise, each grating 243 and 247 of the second set has a reflection response that also satisfies the Bragg condition for light incident upon it: $2\Lambda_2 \cos (90° - \Theta) = m_2 \lambda_0/n_{eff2}$, where $\Lambda_2$ is the pitch of gratings 243 and 247, $90° - \Theta$ is the angle of incidence which light 25I makes with respect to the normal to gratings 243 and 247 (because gratings 243 and 247 are oriented perpendicular to gratings 241 and 245), $m_2$ is another integer that represents a diffraction order and $n_{eff2}$ is the effective refractive index in the waveguide area including the gratings 243 and 247. This pair of conditions reduces to $$\tan \Theta = \frac{(n_{eff1} \Lambda_1/m_1)}{(n_{eff2} \Lambda_2/m_2)}, \text{ and}$$

$$\frac{\lambda_0}{2} = (n_{eff1} \Lambda_1/m_1) \cos \Theta = (n_{eff2} \Lambda_2/m_2) \sin \Theta.$$

Thus, for any tuning and pair of diffraction orders $(m_1,m_2)$ of the respective orthogonal sets of grating reflectors, there will exist a unique pair of propagation directions in a single ring mode and a unique wavelength of light that will lase. Preferably, the grating reflectors will be tuned so that the light will propagate substantially along the length of the active gain region 249, as shown, and also so that the wavelength $\lambda_0$ falls within the gain band of the semiconductor material making up the active gain region 249.

The periodic grating reflectors 241, 243, 245 and 247 provide distributed reflection that spreads the light 251 upon reflection over parallel adjacent paths, thereby avoiding the problem of light filamentation. The grating reflectors 241, 243, 245 and 247 may have a square or rectangular shape, as shown, with length and width parameters $l_1, l_2, w_1$ and $w_2$ selected independently from the ring mode propagation directions. Alternatively, the grating reflectors 241, 243, 245 and 247 could have a parallelogram shape, as represented in FIG. 15 by the dashed boundary lines 253 that are aligned with both propagation directions of light 251 in the ring mode. This parallelogram shape would ensure uniform reflection of the incident light 251 across the entire width of the gain region 249. Note that the rectangular shape of gratings 241, 243, 245 and 247 have corner portions which do not contribute reflection of light in the ring mode shown so that reflection is highest for light incident from or reflected back into the center portion of the active gain region 249 and lowest for light to or from the side portions of the active gain region 249, which is an effect that may be preferred in some applications and not preferred in others. The length L of the gain region 249 may be selected independently from the other dimensions. The side facets 255 and 257 are preferably antireflection coated to avoid creation of a side-to-side collinear Fabry-Perot cavity mode.

Figure 16:
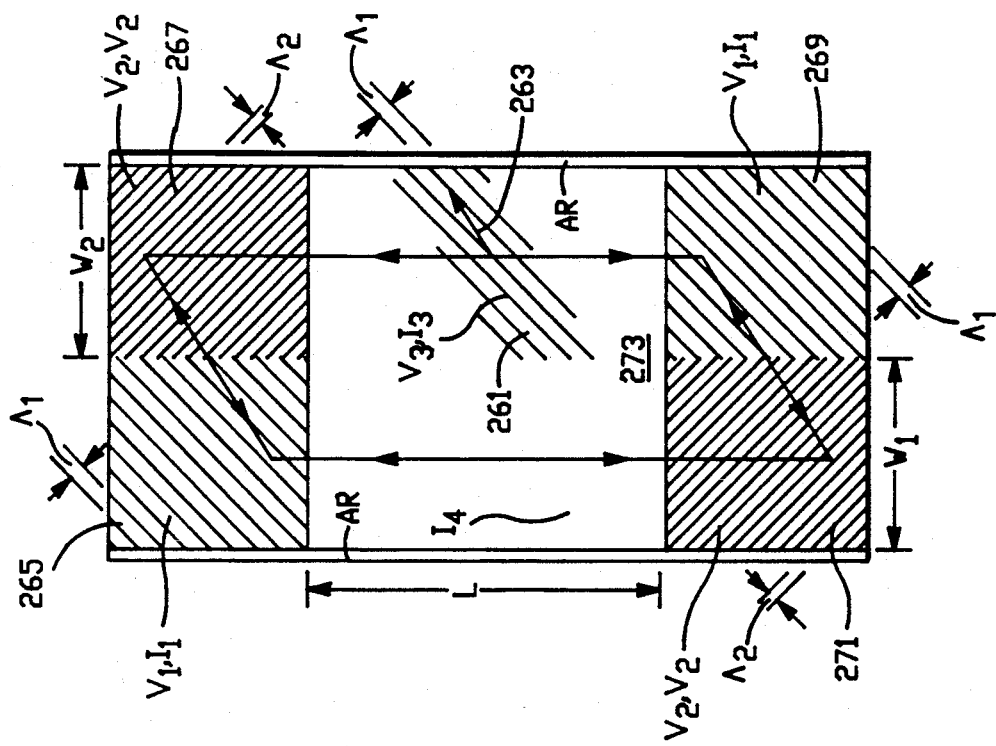

Laser light 251 in the cavity may be extracted by a detuned grating 259 to form a surface emitted output beam. Laser light would also be extracted by partial transmission through any of the periodic grating reflectors 241, 243, 245 and 247. FIG. 16 shoWs a ring laser embodiment exactly like the embodiment in FIG. 15, except that an angled periodic grating reflector 261 is used to extract the laser light 263 from the optical cavity by partial reflection. Preferably, this intracavity grating 261 has the same pitch $\Lambda_1$ and orientation as one of the two orthogonal sets of periodic grating reflectors 265, 267, 269 and 271 that define the optical cavity. The intracavity grating region may be electrically isolated from the surrounding active gain region 273. When the reverse bias voltage $V_3$ or injected current $I_3$ into the intracavity grating region 261 is the same as the voltage $V_1$ or current $I_1$ applied to the corresponding set of periodic gratings 265 and 269, the grating 261 diffracts light out of the cavity to temporarily form an output beam, but also acting as a lossy region that kills lasing action. When the voltage or current $V_3$ or $V_1$ to the intracavity grating region 261 is different from the voltage $V_1$ or current $I_1$, the grating 261 is detuned from the Bragg condition for the wavelength selected by the cavity grating reflectors 265, 267, 269 and 271, so that its diffraction efficiency is greatly reduced, rendering the grating region 261 transparent. Then the cavity loss is greatly reduced and the structure lases. By applying short current or voltage pulses to the grating region 261, the grating region may act as a Q-switch, alternately storing and dumping optical energy in the cavity, provided the drive current $I_4$ to the active gain region 273 is intermediate to that required for threshold in the two states. If drive current $I_4$ is at or above the device threshold for both states, then causing the intracavity grating region 261 to diffract light out of the cavity will not completely kill lasing action, and the output amplitude can be modulated by varying bias voltage $V_3$ or current $I_3$ to the intracavity grating 261.

Figure 17:
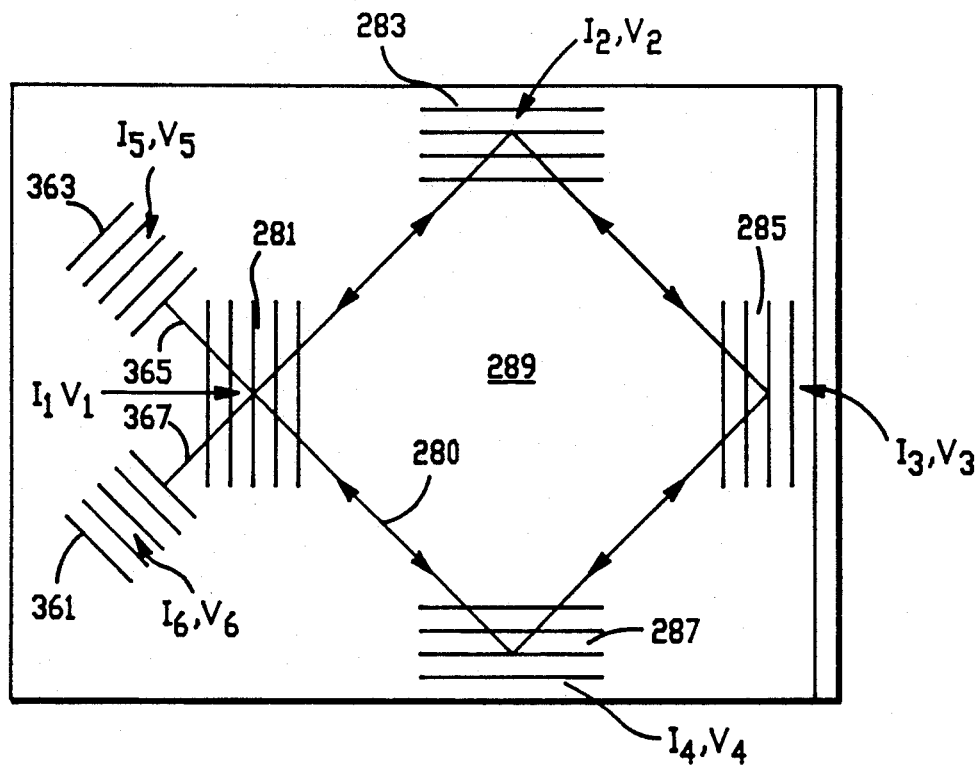

With reference to FIG. 17, a semiconductor ring laser embodiment has four periodic reflectors 281, 283, 285 and 287, such as gratings or dielectric stacks. All four of the periodic reflectors 281, 283, 285 and 287 are tuned for angled diffraction of the lightwaves, and are positioned and oriented around a broad area active gain region 289 so that light paths in a ring mode, represented in FIG. 17 by the path 280, form closed loops in the resonant cavity defined by the periodic reflectors 281, 283, 285 and 287. In the example shown in FIG. 17, each grating or other periodic reflector 281, 283, 285 and 287 is tuned for right angle reflection of 45° incident light, and are placed and oriented as mirrors at the four corners of a square. Other configurations are also possible. Gratings 361 or 363 may be used as either detuned output coupling gratings or as an outside-thecavity grating that causes a small amount of optical feedback into the cavity, thereby causing unidirectional operation of a ring mode.

Figure 18:
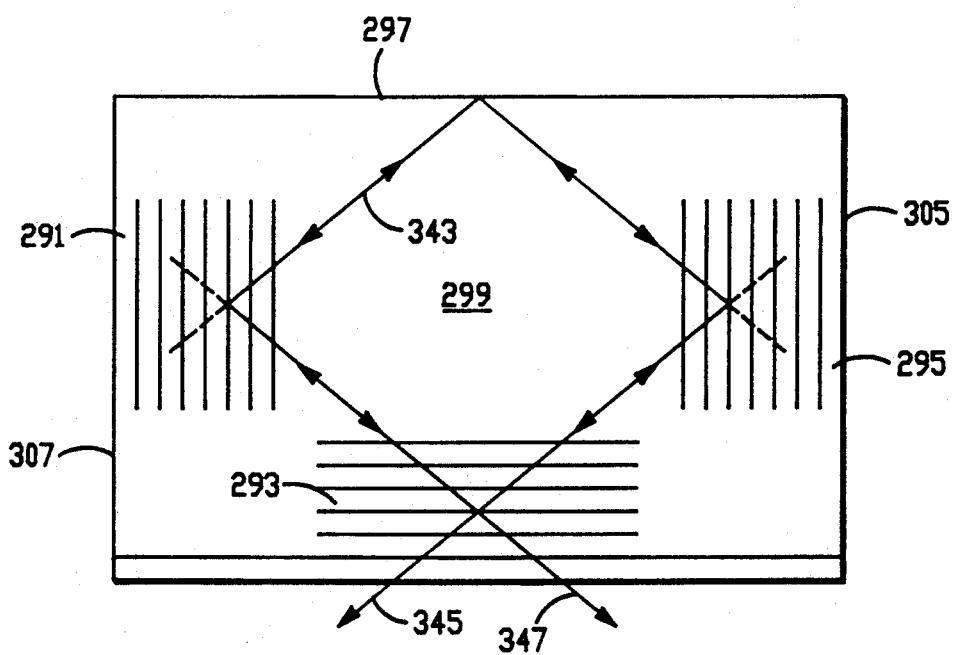
Figure 19:
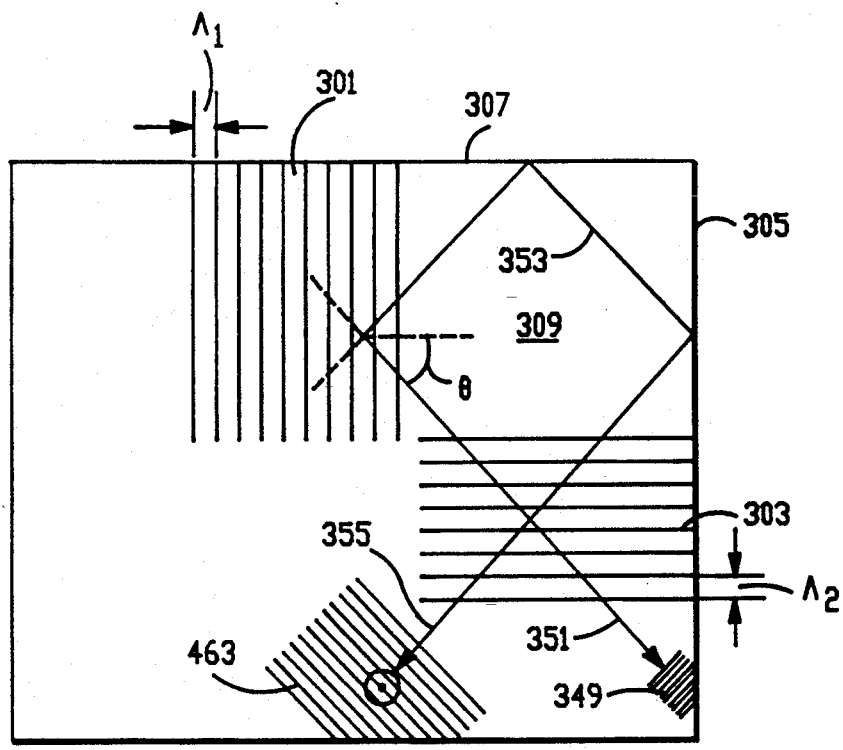

FIGS. 18 and 19 show other ring laser embodiments that replace one or two of the periodic reflectors of the embodiment shown in FIG. 17 with facet reflectors. In FIG. 18, the laser structure has three periodic reflectors 291, 293 and 295 and one facet reflector 297 bounding a central broad area active region 299. In FIG. 19, the laser structure has two periodic reflectors 301 and 303 on adjacent sides of the broad area gain region 309, and two facet reflectors 305 and 307, also on adjacent sides of the broad area gain region 209. In each case shown in FIGS. 17-19, the periodic reflectors are arranged in two orthogonal sets, with each set having one or two periodic reflectors. However, as shown in FIGS. 10-12 and 14, the gratings and other reflectors need not necessarily be orthogonal, but simply arranged to create a closed mode pattern, wherein the angle of incidence from any reflector equals the angle of reflection and the mode closes around a ring. The facet reflectors 297, 305 and 307 in FIGS. 18 and 19 may be cleaved or ion milled facets, and are preferably totally internally reflecting at the incidence angle of the lasing mode. Any facets which are not totally internally reflecting may be coated for high reflectivity. Laser light may be extracted from the ring cavity by partial transmission through one of the reflectors, i.e. either through a periodic reflector, a surface emitting grating, or through a non-totally internally reflecting facet.

In order to define a resonant cavity that favors only a single mode of oscillation for lightwaves propagating in the laser active medium, there must be at least two periodic reflectors that are not both parallel to one another and tuned for the same reflection response. For example, in FIG. 18, the two periodic reflectors 291 and 295 are not sufficient to establish a single mode of oscillation, because they are parallel to each other and tuned for reflection at the same incidence angle for each wavelength of light. However, either of these periodic reflectors 291 or 295 together with the periodic reflector 293 is sufficient to establish a single mode of oscillation, provided only one pair of diffraction orders $m_1$ and $m_2$ for the periodic reflectors selects a wavelength that falls within the gain bandwidth of the semiconductor material.

In ring lasers with periodic reflectors, such as gratings, like those seen in FIGS. 17-19, one grating reflector, by itself, effectively defines a unique frequency or wavelength (more precisely, an extremely narrow band of frequencies) that will be reflected by the grating for each angle of incidence, and likewise effectively defines a unique angle of incidence (more precisely, an extremely narrow range of incidence angles) that will allow reflection by the grating for each frequency or wavelength of light. The grating thus allows reflection of light for a plurality of frequency-incidence angle combinations. While facet reflectors fix the angle of incidence onto the grating in folded cavity lasers by requiring normal incidence and reflection onto the facet for obtaining a return along the same path, in ring laser embodiments, the facets are non-selective of either frequency or incidence angle, reflecting all light incident upon them. A second periodic reflector that is not simply an extension of the first periodic reflector, that is, which is not both parallel to and tuned to the same reflective response as the first periodic reflector, would provide selection of one of the frequency-incidence angle combinations allowed by the first periodic reflector. For example, a second grating reflector orthogonal to the first grating would provide the necessary selectivity for single mode oscillation assuming the periods and angles are chosen so that only one set of mode orders lies within the gain bandwidth for the laser.

The resonant condition of the ring lasers in FIGS. 17-19 is satisfied when the Bragg conditions for reflection off of both orthogonal sets of periodic grating reflectors is satisfied. For example, in FIG. 19, there is reflection off of the first grating 301 if $2_{\zeta 1} \cos\Theta = m_1\lambda_0/n_{\text{eff1}}$, where $\Lambda_1$ is the pitch or periodic separation of grating teeth for grating 301, $\Theta$ is the incidence angle on the grating 301, $m_1$ is an integer representing the diffraction order, $\lambda_0$ is the free space wavelength of the incident light and $n_{\text{eff1}}$ is the effective refractive index of the waveguiding medium at the grating 301. Likewise, for the orthogonal second grating reflector 303, there is reflection if $2\Lambda_2 \cos(90° - \Theta) = m_2\lambda_0/n_{\text{eff2}}$, where $\Lambda_2$ is the pitch of grating 303, $90° - \Theta$ is the incidence angle on the grating 303, $m_2$ is an integer representing the diffraction order and $n_{\text{eff2}}$ is the effective refractive index of the waveguiding medium at grating 303. The resonance condition reduces to $$\lambda_0 = 2(n_{\text{eff1}} \Lambda_1/m_1) \cos\Theta = 2(n_{\text{eff2}} \Lambda_2/m_2) \sin\Theta, \text{ and} \quad (1)$$

$$\tan\Theta = \frac{(n_{\text{eff1}} \Lambda_1/m_1)}{(n_{\text{eff2}} \Lambda_2/m_2)} \quad (2)$$

Because different pairs of diffraction orders $m_1$ and $m_2$ for the gratings 301 and 303 will provide resonance for different wavelengths and propagation directions, each wavelength and propagation direction pair corresponding to a possible ring mode, we must choose grating periods $\Lambda_1$ and $\Lambda_2$ along with angle $\Theta$ so that the possible modes allowed by the resonance condition for different diffraction order pairs $m_1$ and $m_2$ are separated in wavelength $\lambda_0$ by greater than the gain bandwidth, which is approximately 5 nm for GaAs. This will cause sufficient differentiation in gain so that only one mode will reach threshold. This is most easily done by choosing the lowest values of $m_1$ and $m_2$, consistent with one's ability to fabricate short period gratings. (Note that for a given fixed wavelength gain band, the lower the values of $m_1$ and $m_2$, the shorter the grating periods $\Lambda_1$ and $\Lambda_2$ that are needed.) Also the incidence angles $\Theta$ and $90° - \Theta$ should be chosen so as not to be too close to the 0° Fabry-Perot or DBR mode.

One way to select grating periods $\Lambda_1$ and $\Lambda_2$ is to first pick a desired wavelength $\lambda_0$, preferably at or near the peak in the gain band of the laser active medium, a desired pair of incidence angles $\Theta$ and $90° - \Theta$ for the ring mode, and trial diffraction orders $m_1$ and $m_2$ (such as $m_1 = 1$, $m_2 = 1$). Then using the Bragg conditions $2\Lambda_1 \cos\Theta = m_1\lambda_0/n_{\text{eff1}}$ and $2\Lambda_2 \cos(90° - \Theta) = m_2\lambda_0/n_{\text{eff2}}$, we would find test grating pitches $\Lambda_1$ and $\Lambda_2$. If these pitch dimensions are not too small to construct with available techniques, the pitches are checked using equations (1) and (2) to find the wavelengths and incidence angles $\lambda_0$ and $\Theta$ for the other possible diffraction order pairs $m_1$ and $m_2$ to see whether any other possible modes also fall within the gain band. The object is to pick grating pitches $\Lambda_1$ and $\Lambda_2$, such that only one mode will oscillate.

EXAMPLE

Assume an effective refractive index $n_{eff1} = n_{eff2} = 3.42$ ($\Theta_{TIR} = 17°$), and a gain band centered at about $\lambda = 1.010$ μm. Choosing $\lambda = 1.010$ μm, $\Theta = 20°$, $m_1 = 1$ and $m_2 = 1$, we find test grating pitches $\Lambda_1 = 0.157$ μm and $\Lambda_2 = 0.432$ μm. Using equations (1) and (2) above for these pitches we find:

|  | $m_2 = 0$ | $m_2 = 1$ | $m_2 = 2$ | $m_2 = 3$ |
|---|---|---|---|---|
| $m_1 = 0$ |  | $\Theta = 90°$ | $\Theta = 90°$ | $\Theta = 90°$ |
|  |  | $\lambda_0 = 2.955$ μm | $\lambda_0 = 1.477$ μm | $\lambda_0 = 0.985$ μm |
| $m_1 = 1$ | $\Theta = 0°$ | $\Theta = 19°58'$ | $\Theta = 36°01'$ | $\Theta = 47°28'$ |
|  | $\lambda_0 = 1.074$ μm | $\lambda_0 = 1.009$ μm | $\lambda_0 = 0.869$ μm | $\lambda_0 = 0.726$ μm |
| $m_1 = 2$ | $\Theta = 0°$ | $\Theta = 10°18'$ | $\Theta = 19°58'$ | $\Theta = 28°36'$ |
|  | $\lambda_0 = 0.537$ μm | $\lambda_0 = 0.528$ μm | $\lambda_0 = 0.505$ μm | $\lambda_0 = 0.471$ μm |

This choice is acceptable. The nearest mode other than the preferred mode ($m_1 = 1$, $m_2 = 1$) to the peak in the gain band ($\lambda = 1.010$ μm) is $m_1 = 0$, $m_2 = 3$ at a resonant wavelength of $\Lambda_0 = 0.985$ μm. This is 25 nm lower than the gain bank peak, so only the preferred mode will reach threshold and lase.

With reference to FIG. 20, the second reflector that fixes the angle of incidence of light on the first periodic reflector in a ring mode need not be part of the primary ring mode cavity. The laser structure in FIG. 20 has a primary cavity defined by a single periodic reflector 311 and three facet reflectors 317, 319 and 321. In the absence of any mechanism to determine the incidence angle and wavelength of light incident on the periodic reflector 311, the cavity would oscillate in multiple modes. A distributed Bragg reflector 313 might be inserted into the primary cavity in the path of lightwaves propagating between any two of the cavity reflectors 311, 313, 315 and 317 oriented for normal incidence of the lightwaves in the preferred mode to scatter light from modes with wavelengths and propagation directions close to the preferred mode and thereby to select the preferred mode over the other possible modes. Alternatively, a distributed Bragg reflector 315 may be placed outside of the primary cavity in a position to receive and reflect light 323 transmitted through the periodic grating reflector 311 back into the cavity. This provides extra feedback to one mode (propagation direction and wavelength) compared with other possible modes, reducing the loss for that mode, so that it has a relatively lower threshold than the other modes. Depending on the selected mode, the facet reflectors 317, 319 and 321 may be totally internally reflecting, or, if not, can be coated for high reflectivity. Light 325 may be extracted from the cavity through any non-totally internally reflecting facet or, preferably, by partial transmission through the periodic reflector 311.

Figure 21:
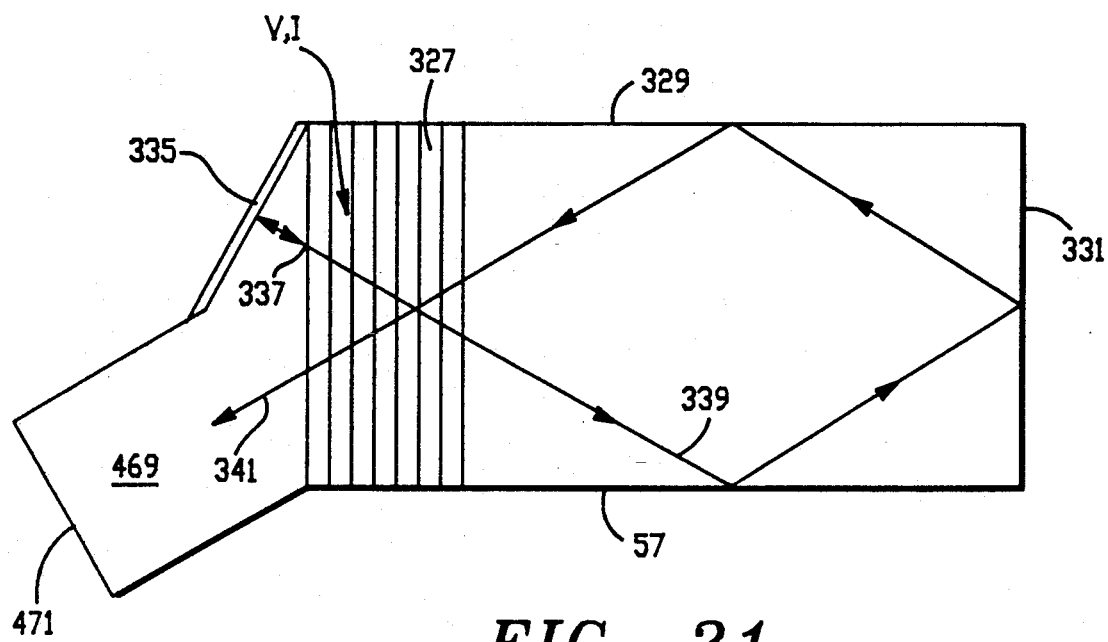

In FIG. 21, another ring laser structure similar to FIG. 20 has a single periodic grating reflector 327 and three facet reflectors 329, 331 and 333 defining a primary ring cavity capable of multiple ring mode oscillation. A broad band reflector 335, such as an ion milled facet, is positioned outside the primary cavity in a position to receive light partially transmitted through the periodic grating 327 at normal incidence and reflect it back into the cavity. Light received by the facet 335 at other than normal incidence will not return upon reflection to the cavity in a direction that corresponds to the same mode as which it left, and therefore will be lost. An advantage of the broad band facet reflector 335 over either of the distributed Bragg reflectors 313 and 315 in FIG. 20 is that the facet 335 does not by itself select both the wavelength and propagation direction, and therefore allows the periodic grating 327 of the primary cavity to select the wavelength based on the propagation direction fixed by the facet 335. The distributed Bragg reflector 313 or 315 in FIG. 20 would need to be tuned to the same propagation direction and wavelength combination that the periodic cavity reflector 311 will reflect. The facet 335 in FIG. 21 is preferably coated for high reflectivity, while facet 471 is preferably AR coated, or a low reflectivity coating may be applied for efficient light extraction.

In both ring laser structures in FIGS. 20 and 21, a Fabry-Perot (FP) mode between the two parallel side facet reflectors 317 and 321, or 329 and 333, in the primary cavity is also a possible mode. A ring oscillator mode will operate only if that ring mode has lower cavity losses or higher gain than the FP mode. For this purpose, we can choose the distance W between the front facet 319 or 331 and the periodic grating reflector 311 or 327 to be larger than the distance L between the side facets 317 a321, or 329 and 333, in order to provide relatively higher gain to the ring mode. We can also choose to make the grating-front facet reflectivity product $R_F R_G$ larger than the reflectivity product $R_1 R_2$ of the side facets, by high reflection coating the front facet 319 or 331, increasing the length, i.e. the number of teeth, of the grating 311 or 327, or by antireflection coating one or both side facets 317 and 321, or 329 and 333. If an antireflection coating is used, the ring mode should be selected so that the incidence angle on the side facets is high enough to provide total internal reflection.

Any of the ring laser structures may be made to have a unidirectional mode of oscillation by providing a mechanism in the semiconductor material body for favoring one ring propagation direction for the lightwaves (clockwise or counterclockwise) over the opposite ring propagation direction for the lightwaves. As an example of a typical bidirectional ring mode, note that the laser embodiment shown in FIG. 18 provides equal feedback for both the clockwise and the counterclockwise directions of propagation of light 343 in the resonant cavity. Both directional modes have substantially the same lasing threshold and will oscillate, so that the output partially transmitted through grating 293 results in two different angular directions of light rays 345 and 347. By contrast, the laser structure in FIG. 19 includes an extra reflector, in this instance a small partially reflective grating reflector 349 that is placed outside the primary lasing cavity defined by reflectors 301, 303, 305 and 307. The extra grating reflector 349 is oriented at normal incidence to one of the two possible emerging beams 351, in this instance the beam from the counterclockwise ring mode, to at least partially reflect this light 351 emerging in one angular direction back into the resonant cavity. The reflected light feeds back into the cavity in the opposite ring direction, in this instance the clockwise ring direction. Because of the extra back reflection provided by the external cavity reflector 349, one ring direction experiences greater feedback compensating for other cavity losses in that direction mode. Thus, one directional ring mode, in this instance the clockwise directional mode, is made to lase preferentially over the opposite directional ring mode. The additional reflector needs only to provide sufficient refection into a favored ring direction to discriminate over the other ring direction in order to establish unidirectional oscillation. A net reflectivity of about 10% is typical. Higher or lower reflectivities can also be used. The unidirectional operation of the laser oscillator produces a single coherent beam 355 that can be extracted by partial transmission through any of the cavity reflectors, in this instance the periodic grating reflector 303.

The DBR grating 315 outside the primary laser cavity in FIG. 20 works in the same way as the grating 349 in FIG. 19 to reflect light 323 transmitted from one ring direction through the periodic cavity reflector 311 back into the cavity in the favored ring direction. The cavity is thus unidirectional, and the single output beam 325 is extracted by partial transmission through a cavity reflector 311. The only difference is that the DBR grating 315 in FIG. 20 also functions to select the incidence angle of lightwaves onto the periodic reflector 311 to establish not only a unidirectional oscillation, but also a single transverse and longitudinal mode of oscillation.

Figure 22:
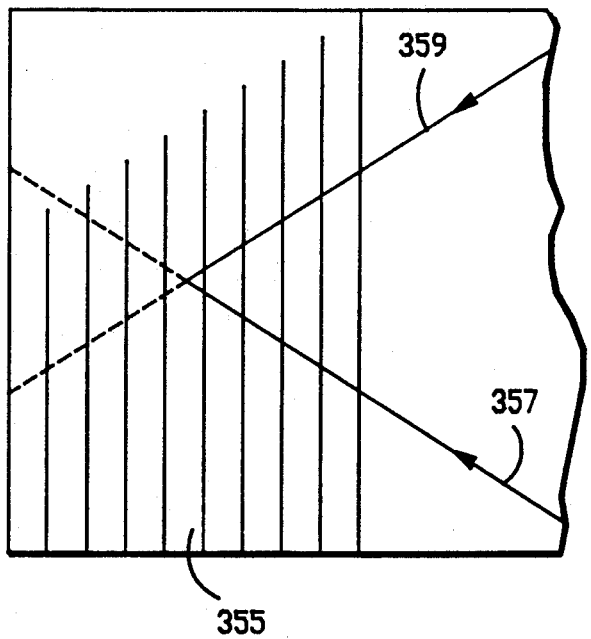
FIG. 22 is a top plan view of a mechanism for providing unidirectional oscillation in ring lasers.

FIG. 22 shows another way to create more feedback in one ring direction, thereby achieving unidirectional ring oscillation in a semiconductor ring laser cavity. One periodic grating reflector 355 defining the ring laser cavity is made asymmetric. Any other grating reflectors defining the cavity can be symmetric. In particular, the grating 355 has a shape that is tailored to be deeper on one side than the other. Lightwaves 357 propagating in the clockwise direction in FIG. 22 will see fewer grating teeth and thus have a lower reflectivity than lightwaves 359 propagating in the counterclockwise direction which encounters the full depth of the grating 355. Accordingly, the counterclockwise ring direction 359 will have lower cavity losses and a lower lasing threshold. Unidirectional ring oscillation will be established in the counterclockwise ring direction 359.

In FIG. 17, the semiconductor ring laser has two additional gratings 361 and 363 placed outside the ring cavity behind a partially transmissive periodic grating reflector 281, and aligner, respectively, with center paths 365 and 367 of the lightwaves for each of the two possible ring directions. Grating 361 is oriented perpendicular to the propagation direction of light 365 transmitted from the clockwise directional mode and can be tuned for reflection at normal incidence. Likewise, grating 363 is oriented perpendicular to the propagation direction of light 367 transmitted from the counterclockwise directional mode and can also be tuned for reflection at normal incidence. Each grating 361 and 363 has adjustable current injection $I_5$ and $I_6$, respectively, or adjustable reverse bias voltage $V_5$ and $V_6$, respectively, to enable separate adjustment of their reflection response. Accordingly, these two added gratings 361 and 363 can be tuned to favor one selected ring mode direction, clockwise or counterclockwise, over the other. In particular, when grating 361 is tuned to peak reflectivity of the light 365 incident upon it from the clockwise ring mode and grating 363 is tuned away from peak reflectivity of the light 367 incident upon it from the counterclockwise mode, reflection by the first grating 361 enhances feedback into the counterclockwise mode, thereby factoring oscillation of that mode over the clockwise mode. Likewise, when grating 361 is tuned away from peak reflectivity of the incident light 365 and grating 363 is tuned to peak reflectivity of the incident light 367, enhanced feedback by grating 363 into the clockwise mode establishes clockwise unidirectional ring mode oscillation.

The laser embodiment in FIG. 21 uses the board band mirror facet 335 to create unidirectional ring mode oscillation in addition to its previously described function of fixing the various lightwave incidence angles in the resonant cavity. An advantage of the board band mirror facet 335 over grating reflectors used to establish unidirectional oscillation is that, unlike grating reflectors, the facet 335 allows the periodic reflector 327 to select the wavelength that matches its reflection response to the incidence angle fixed by the facet 335. In some embodiments, like that seen in FIG. 19, a grating reflector 349 positioned to provide feedback of a particular light direction and wavelength could lead to fabrication difficulties due to alignment and pitch tolerances for a required match with the light propagation direction and wavelength already selected by the periodic cavity reflectors 301 and 303. By contrast, the broad band facet reflector 335 in FIG. 21 fixes only one of the two parameters, i.e. propagation direction, leaving the choice of the best wavelength to the periodic reflector 327. The facet 335 may be ion milled an can be coated for high reflectivity. The facet 335 is oriented in FIG. 21 to provide extra feedback into the counterclockwise ring mode direction.

An advantage of unidirectional ring laser operation over bidirectional operation is that such lasers are very stable sources, since small amounts of noise and external feedback of the beam upon itself, provided such feedback is significantly smaller than the feedback provided by the additional reflector, will not affect the laser's operation. There will not be any random switching of ring oscillation direction. Further, when only one ring oscillation direction oscillates, the coherent output beam can be fully extracted by a single output coupler, thereby improving overall efficiency of the device.

Figure 23:
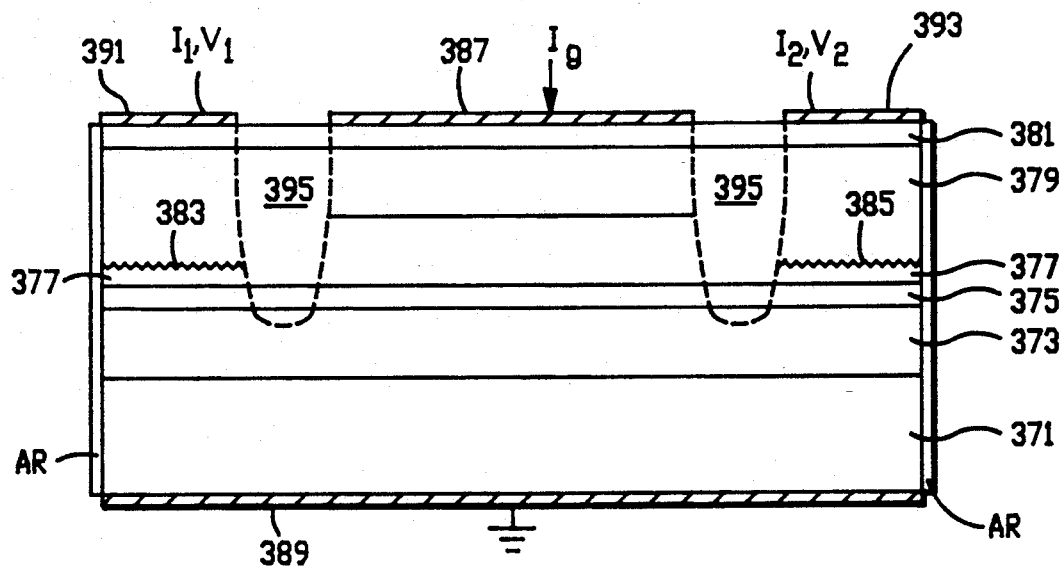
FIG. 23 is a side view of a semiconductor ring laser embodiment, such as lasers in FIGS. 15-18, featuring two cavity gratings tunable for providing amplitude modulation of the output beam.

With reference to FIG. 23, wavelength tuning, frequency modulation, amplitude modulation, beam steering, or a combination of several of these procedures, can be accomplished by actively changing the reflection response of one or more of the periodic grating reflectors. Typical semiconductor diode lasers of the present invention have a plurality of contiguous semiconductor layers disposed on a substrate 371. Typical layer compositions might be n-GaAs for substrate 371, n-$Al_{0.4}Ga_{0.6}As$ for a lower cladding layer 373, p-$Al_{0.2}Ga_{0.8}As$ for a first upper cladding layer 377, p-$Al_{0.4}Ga_{0.6}As$ for a second upper cladding layer 379 and p-GaAs for a cap layer 381. The active region 375 can be, for example, a single GaAs or InGaAs layer or a junction well structure of many thin layers of alternating GaAs and AlGaAs composition. The first upper cladding layer 377 would generally be only about 0.5 $\mu$m thick to ensure that gratings 383 and 385, formed between the first and second upper cladding layers 377 and 379, are sufficiently close to the active region 375 to interact with lightwaves propagating in the active region 375 and neighboring layers 373, 377 and 379. The active region 375 is electrically pumped by injecting a drive current $I_g$ through the active region between a gain electrode 387 and a substrate electrode 389.

The wavelength-versus-angle reflection response of the gratings 383 and 385 in the laser structure can be changed by changing the amount of injected current $I_1$ or $I_2$ or the reverse bias voltage $V_1$ or $V_2$ applied to the grating regions. For this purpose, the grating regions may have individually addressable electrode contacts 391 and 393 on the top surface of the laser structure above the gratings 383 and 385. Isolation regions 395, such as those made by proton implantation or silicon IID, are present to electrically isolate the various surface contacts 391, 393 and 397. Thus, each grating 383 and 385 may be actively tuned independently of any others by a separate application of current or bias voltage. A change of injected current $I_1$ or $I_2$, or a change in reverse bias voltage $V_1$ or $V_2$, changes the charge carrier density and thus the effective refractive index $n_{eff}$ in the grating regions, thereby changing the effective grating pitch by an amount $\Delta\Lambda_{eff} = \Delta n_{eff}\Lambda$. As a consequence of this change in the effective grating pitch, the reflection response, expressed as the wavelength reflected at a particular incidence angle or the incidence angle needed for reflection of a particular wavelength of light, changes. Depending on the particular laser structure and the particular grating or gratings being actively tuned in this manner, the result may be frequency tuning, amplitude or frequency modulation or steering of the laser's output beam.

In the structure of FIG. 1, active tuning of grating 35 with current $I_3$ or bias voltage $V_3$ alters the frequency or wavelength of the light output. This allows frequency tuning, or, if the tuning is continuously changed, provides frequency modulation. If the light output is taken through a detuned second order surface emitting grating 397, this change in frequency causes longitudinal steering of the beam's output direction. Steering without altering the frequency or wavelength of the light output can be accomplished by actively tuning the surface emitting grating 397 while leaving the tuning of periodic grating reflector 35 unchanged. In the laser structure of FIG. 2, the same active tuning of grating 35 will alter the frequency or wavelength of the light output. The DBR gratings 47 and 49 should be also simultaneously tuned to match their peak reflection to this output frequency or wavelength. If the tuning of either DBR grating 47 or 49 is not changed along with periodic grating reflector 35, or one of the DBR gratings 47 or 49 is detuned while the other gratings are left alone, then the cavity losses and lasing threshold will increase. If the drive current $I_g$ is near threshold, amplitude modulation may result from alternately tuning and detuning the relative responses of the DBR gratings with the angled grating 35.

In the laser structure of FIG. 3, any of the periodic grating reflectors 63, 65 and 67 may be separately tuned to provide a specified multi-wavelength output through facet 75 or a multi-wavelength laser array output through facet 73. If all of the grating reflectors 63, 65 and 67 are tuned together to select the same reflection response, a selected single wavelength, phase-locked laser array output through facet 73 can be provided.

Active tuning of the single periodic grating reflectors 85, 101, 153, 177, 187, 221 and 233 in FIGS. 4, 5, 7, 9, 10, 13 and 14 results in wavelength or frequency tuning of the laser light output in the same manner as tuning the grating 35 in FIG. 1. Likewise, simultaneous active tuning of all grating reflectors 125, 127 and 149 in FIG. 6, 165 and 169 in FIG. 8, 201 and 203 in FIG. 11 and 209, 211 and 213 in FIG. 12, can provide wavelength or frequency tuning of the laser light output without changes in amplitude or beam output direction. However, changing some but not all of these gratings will cause threshold and possible amplitude changes or cause beam steering, as explained for surface emitting grating 397 in FIG. 1 or DBR gratings 47 and 49 in FIG. 2.

In the laser structures of FIGS. 15-19, if all of the periodic grating reflectors in one set of cavity reflectors are together actively tuned relative to another set of cavity reflectors, the mode specified by the relative tuning will be changed. This will alter both the wavelength of the light oscillating in the resonant cavity and the angles of incidence on the gratings. Simultaneous frequency tuning and beam steering are obtained. If both sets of gratings are proportionately tuned, the wavelength of the light will change, but the incidence angles will remain the same ($\tan\Theta = (n_{eff1}\Lambda_1/m_1) / (n_{eff2}\Lambda_2/m_2)$, from equation (2) above). This active tuning of all grating reflectors within a set is illustrated in FIG. 16, where gratings 265 and 269 of the first set are each tuned by the same bias voltage $V_1$ or current $I_1$, and where gratings 267 and 271 of the second set are each tuned by a bias voltage $V_2$ or current $I_2$ different from the first. Alternatively, if one of the periodic grating reflectors is actively tuned independently from the other periodic grating reflectors in the same set, resonance of the cavity will not be maintained, because if one grating does not allow Bragg reflection of the cavity mode, the device will not lase. This type of active tuning is illustrated in FIG. 17, where each grating reflector 281, 283, 285 and 287 is separately tunable by respective currents $I_1$, $I_2$, $I_3$ and $I_4$ or voltage biases $V_1$, $V_2$, $V_3$ and $V_4$. In FIG. 18, gratings 291 and 295 of the same set might also be independently tunable with respect to each other, as well as be tunable together relative to grating 293 in the other set.

Amplitude modulation can be obtained in any of the laser structures that have two or more grating reflectors in the optical cavity that can be actively tuned out of a resonance condition. Previous modulation techniques have had difficulty providing amplitude modulation at high data rates, because they have relied on swinging the large drive current above and below the lasing threshold. Because the gratings can be tuned rapidly in their reflection response with a much smaller change in injected current or reverse bias voltage, very high speed, low power modulation can be achieved. That is, instead of driving a 200 mA current modulation through the gain section of a typical 150 mW cw single-mode laser, the pump current is held constant and grating reflectivities are tuned in and out of resonance at gigahertz rates with not more than about 5 V or 5 mA swings in the grating sections. For even higher speed, lower doping concentrations ($10^{17}$/cm$^3$ to $10^{18}$/cm$^3$) in the cladding layer on which the gratings are formed and in the active region below the gratings, semi-insulating substrates, or both, can improve performance.

When actively tuning gratings in ring laser structures that employ a mechanism to create unidirectional oscillation, care should be taken to ensure that the selected mode has a light propagation direction that is perpendicularly incident upon the directional mechanism and also has a wavelength that is reflected by the mechanism. For example, in FIG. 19, only one pair of tunings for the gratings 301 and 303 will satisfy any fixed reflection response of the additional grating 349. Tunability of the additional grating 349 will allow proportionate tuning of cavity gratings 301 and 303 so that the same incidence angles are present in the resonant mode, and so that the selected wavelength is the same as the wavelength reflected at normal incidence by the additional grating 349.

Figure 24:
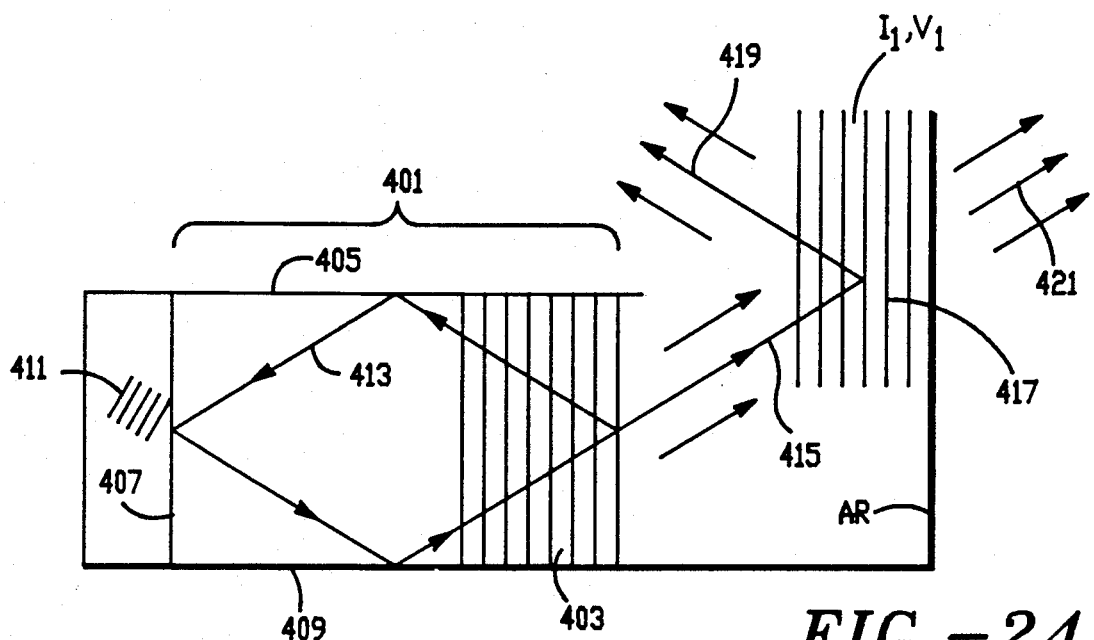

With reference to FIG. 24, a ring laser 401 has four main cavity reflectors 403, 405, 407 and 409 including at least one periodic reflector 403 tuned for angled reflection of a desired ring mode, represented by path 413, and an additional reflector 411 outside of the main cavity for causing unidirectional oscillation and, in the case where there is only one periodic cavity reflector 403, for fixing the incidence angles of the desired ring mode 413 corresponding to normal incidence on the additional reflector 411. The periodic cavity reflector 403 and the additional reflector 411 should allow reflection at the same wavelength, and may need to be actively tuned to provide this reflection response, in order to achieve resonance. The resulting light output beam 415 partially transmitted through the grating reflector 403 is incident upon yet another tunable grating 417. Preferably, the tunable grating 417 has the same grating pitch as and is aligned parallel to the grating reflector 403. By varying the injected current $I_1$ or reverse bias voltage $V_1$, the tunable grating 417 can be made to come into and out of reflection response for the output beam 415. When it is in reflection resonance, the incident beam 415 is deflected backward in one direction, indicated by path 419. When it is out of reflection response, the beam 415 is transmitted through the grating 417 with little or no loss, indicated by the path 421. Thus, the collimated beam output 415 from the ring laser can be either deflected or transmitted in separate spatial directions, as desired.

Figure 25:
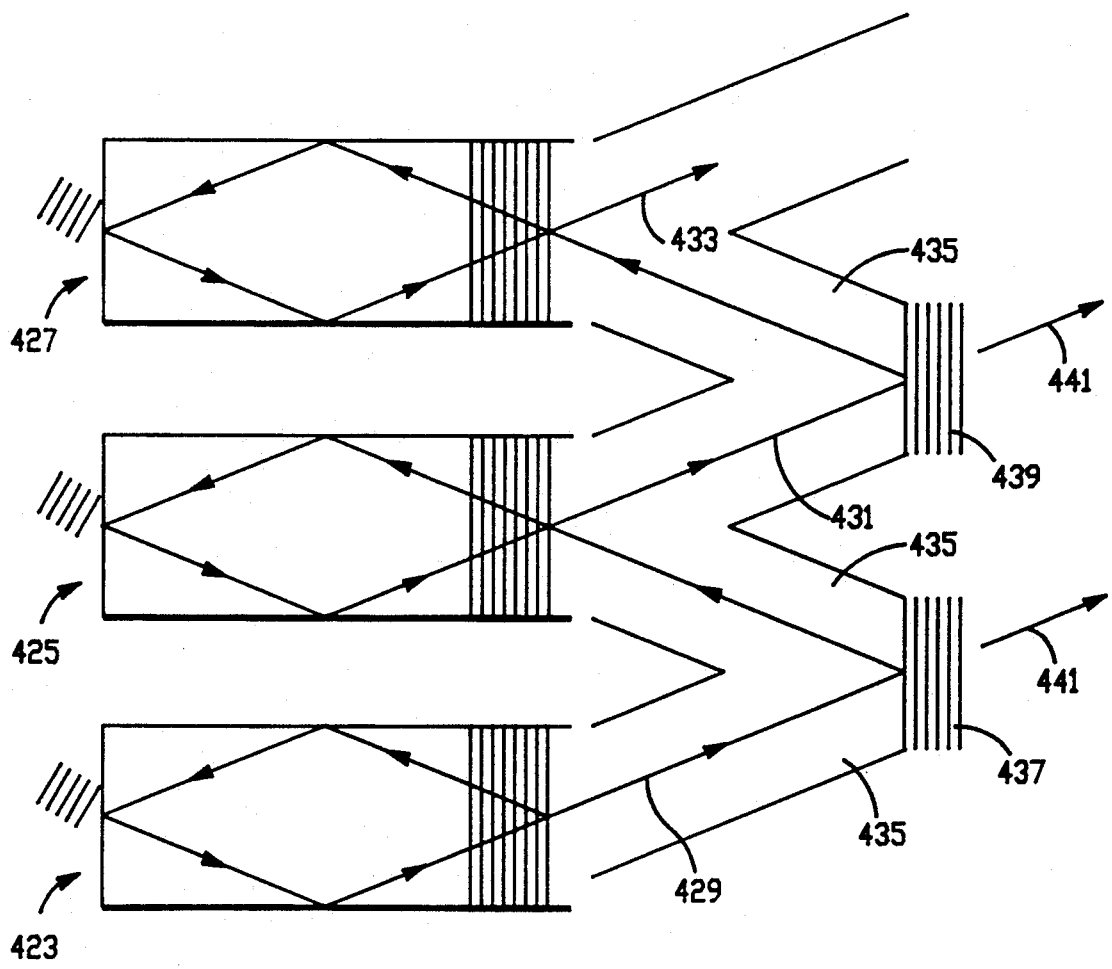
FIG. 25 is a top plan view of a laser array employing plural semiconductor ring laser cavities of the present invention.

With reference to FIG. 25, a multicavity ring laser array can be formed from a plurality of ring lasers 423, 425, 427, etc., each with periodic grating reflectors tuned for angled diffraction, as, for example, in the unidirectional laser structures of FIGS. 19 or 24. The output beams 429, 431, 433, etc. could be coupled into an optical amplifier 435 leading to and from an array of partially transmissive grating reflectors 437, 439, etc. Light transmitted by reflectors 437, 439, etc. form the output beams 441, while light reflected by the reflectors 437, 439, etc. are coupled into the adjacent ring laser 425, 427, etc. via amplifier sections 435.

Any of the laser structures of the present invention can be used as a master oscillator in MOPA configuration. Likewise, any of the structures may extract the light output through an edge facet or through surface emission by a detuned second order grating. In FIGS. 1 and 2, the light 45 partially transmitted from the broad area cavity region 33 through the periodic grating reflector 35 is received by an optical amplifier 443 that is positioned behind the grating reflector 35 and independently pumped with a drive current $I_4$. In FIG. 1 the now amplified light 45 is emitted through the surface of the device by means of a detuned second order grating 397 positioned at the end of the optical amplifier 443 opposite from grating 35. In FIG. 2, the amplified light 45 is emitted through a facet 447, which is preferably antireflection coated for low reflectivity. Likewise, in FIGS. 3-6 and 21, optical amplifiers 449, 453, 457, 461 and 469 may be placed outside of the resonant cavity behind a periodic partial reflector 67, 85, 101 or 125 of the cavity. The amplified light may be extracted through an edge facet 451, 455, 459 or 471, preferably antireflection coated, or by surface emission with a detuned grating 149, as in FIG. 6, placed at an end of the optical amplifier 461.

In FIG. 19, a surface emitting grating 463 is used to extract the light 355 from the semiconductor body. Likewise in FIG. 20, a surface emitting grating 467 is placed to receive the light 325 output from the laser cavity and emit the received light through the semiconductor body's top surface. The region 465 between the lasing cavity and the surface emitting grating 467 may be unpumped, if the distance in the unpumped region is small enough to avoid significant attenuation due to light absorption. Otherwise, it is electrically pumped, at least to the point where attenuation is zero. This region 465 could also be made with higher bandgap material, or doped with aluminum or zinc to increase its bandgap or disorder the active region, thereby creating a transparent window region between the lasing cavity and the surface emitting grating 467. Window regions could replace any of the aforementioned optical amplifiers, if desired.

With reference to FIG. 26, a ring laser oscillator portion 473 is followed by a power amplifier portion 475 for output enhancement. The ring oscillator portion 473 in FIG. 26 includes parallel front and back periodic grating reflectors 477 and 479, of which grating 477 is partially reflective and partially transmissive and grating 479 is highly reflective. Remaining main cavity side reflectors may be facets 481 or refractive index boundaries 483. The refractive index boundary 483 can be formed by etch and regrowth, doping with an impurity or other well known techniques or may be an ion etched facet or a grating. A small grating or facet reflector 485 outside of the main cavity may be used to fix the propagation directions of the mode, so that the incidence angles on the cavity reflectors 477, 479, 481 and 483 are fixed and so that unidirectional ring oscillation is established. The power amplifier 475 is oriented at an angle for accepting the light 487 from one ring direction, in this instance from the counterclockwise ring direction. In ring embodiments, unidirectional oscillation is preferred so that light generated by the laser oscillator will not be wasted. The light 487 received by the optical amplifier 475 is amplified and extracted by a surface emitting grating 489 at the end of the amplifier 475 or by an AR coated edge facet 491. The laser oscillator 473 and amplifier 475 are typically electrically pumped by independent drive currents.

Figure 27:
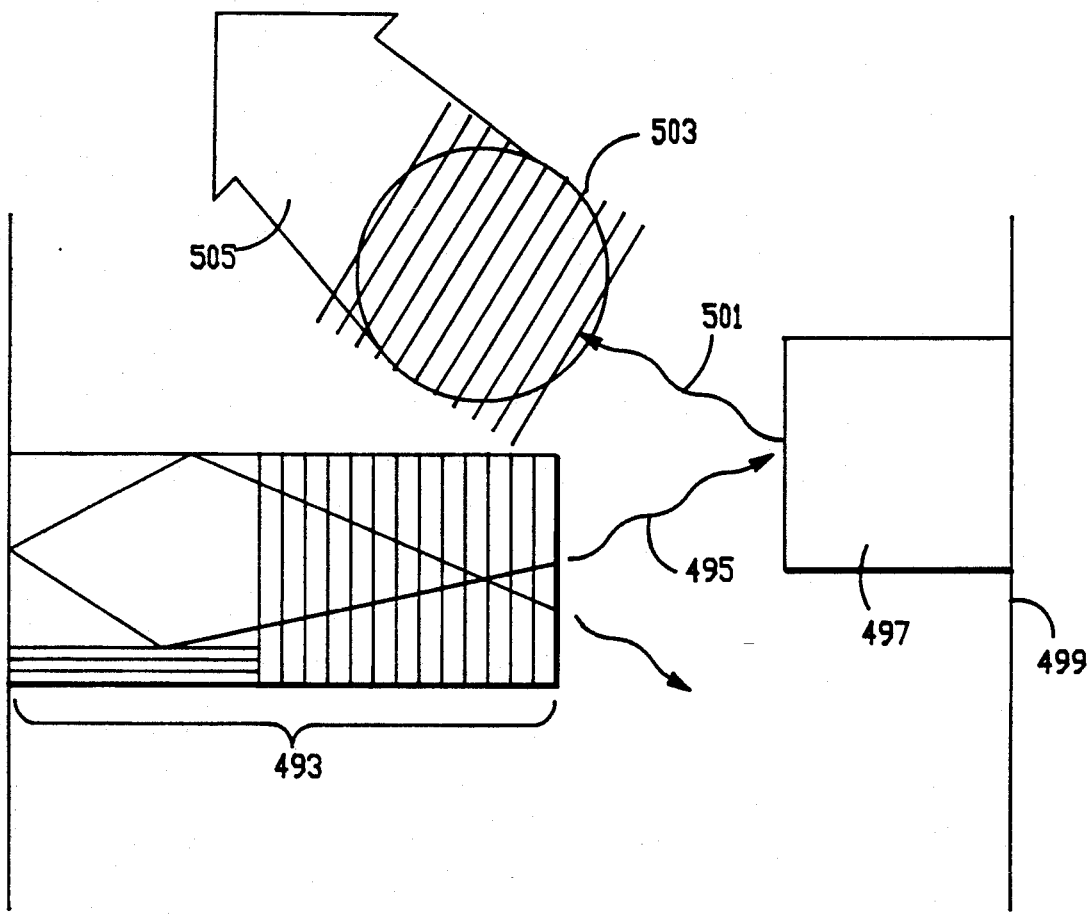

In FIG. 27, the laser light 495 produced by a laser oscillator 493 of the present invention and received by an optical power amplifier 497 may be incident upon and reflected at an angle by a reflector 499, such as a high reflection coated facet reflector. The reflected light 501 then passes through the amplifier 497 again, being further amplified, and is directed toward an output coupler 503, such as the surface emitting grating 505, to produce the output beam 505.

The surface emitting gratings 489, 503, et al. are oriented for normal incidence of the light being received, and may be detuned so that its pitch or tooth spacing $$\Lambda = \frac{p \lambda_0}{2 n_{\mathit{eff}}},$$

where p is close to, but not equal to a positive even integer 2,4,6, etc., $\lambda_0$ is the free space wavelength of the laser lightwaves, and $n_{eff}$ is the effective refractive index of the grating region. The light then coupled out of the surface of laser body in the same manner as other well known grating-coupled surface emitting lasers. Tuned second order or other even order gratings can provide both surface output coupling and feedback to the resonant mode. A 45° angled facet reflector could also be used for surface emission.

Figure 28:
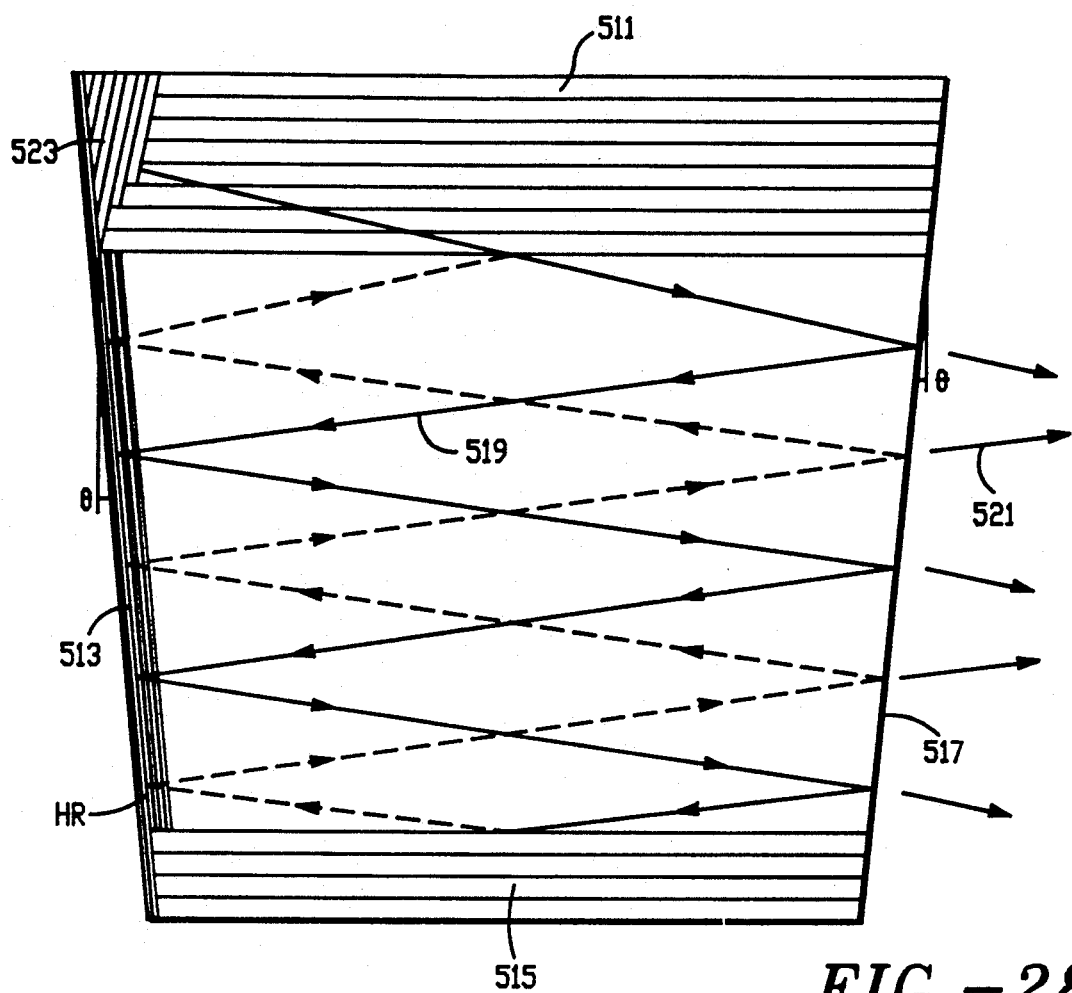
FIG. 28 is a top plan view of yet another semiconductor ring laser embodiment of the present invention.

With reference to FIG. 28, a ring laser has four reflectors 511, 513, 515 and 517, two of which 513 and 517 are aligned at an angle Θ from the normal to reflectors 511 and 515 and not parallel to each other. This forces the laser light 519 in the optical cavity defined by these reflectors to traverse the laser in a zigzag or folded path that closes on itself only after traversing the entire area of the cavity. Thus the lightwaves are forced to couple across the entire area and the resulting ring mode presents a coherent output beam 521 across its entire emitting facet 517. Three of the reflectors 511, 513 and 515 may be grating reflectors tuned to reflect light incident upon it at a particular angle corresponding to the desired mode. Either of the parallel grating reflectors 511 and 515 can be replaced with a cleaved facet or etch-and-regrowth index boundary. The structure may also employ index or gain guiding along the desired light path to provide preferential gain for the desired mode and an array of coherent output beams 521. A small grating reflector 523 at one end of and perpendicular to the folded light path, may be used to cause unidirectional ring oscillation or select the proper mode of oscillation.

The device shown in FIG. 29 creates a ring mode in which light propagation is not parallel to or in the plane of the active region 531, but which bounces back and forth at non-normal incidence through the active region 531 between a pair of multilayer Bragg reflectors 533 and 535 above and below the active region 531 and between a pair of dielectric stack reflectors 531 and 539 at opposite ends of the active region 531 and multilayer Bragg reflectors 533 and 535. The multilayer Bragg reflectors are tuned for one specified reflection response in which the layer thicknesses play the same role as the tooth spacing in the grating reflectors. The dielectric stack reflectors 537 and 539 have another reflection response to select a mode with a particular wavelength incidence angle combination, in the same manner as FIGS. 15-19. One of the multilayer Bragg reflectors can be partially transmitting to couple light out through a surface 539 of the laser body. The electrodes 543 on the light emitting surface 539 should be placed on the sides of the pumped region in a pair of lengthwise strips spaced apart parallel to a central light emitting opening between the electrodes 543. The electrode 541 on the opposite surface can cover the entire surface area.

Figure 29:
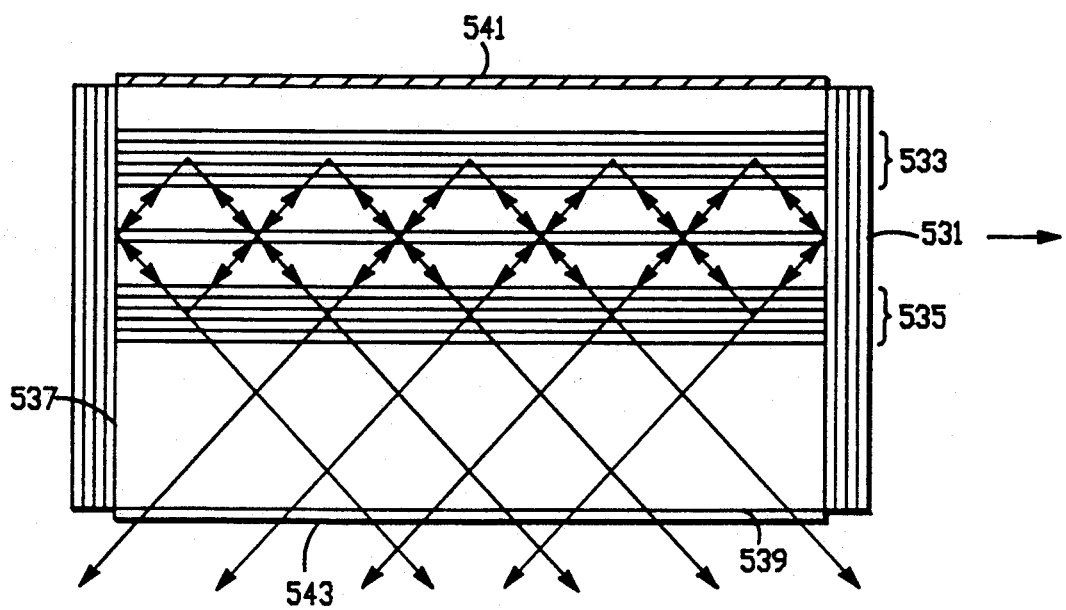
FIGS. 29 and 30 are side elevational views of semiconductor ring lasers employing multilayer Bragg reflectors in place of grating reflectors.
Figure 30:
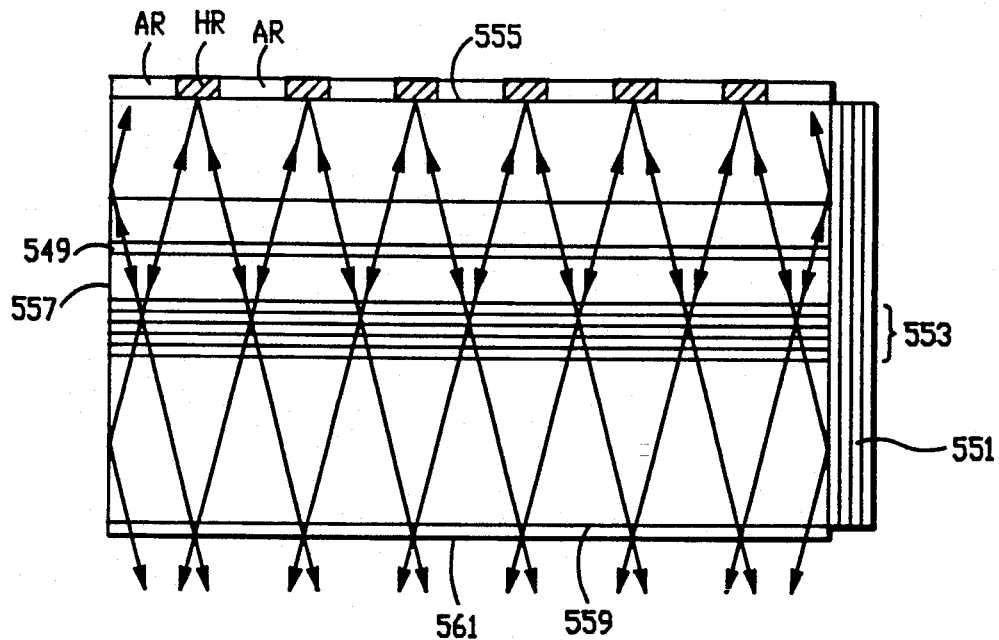

With reference to FIG. 30, the periodic reflectors 533 and 537 in FIG. 29 can be replaced with a patterned reflector 555 on the top surface of the laser heterostructure. This alternate structure includes a multilayer Bragg reflector 553 below the active region 549 like the multilayer reflector 535 in FIG. 29. The patterned reflector 555 has alternating high and low reflectivity regions HR and AR that define an angle of incidence and reflection for a single transverse mode by the spacing between high reflectivity regions HR relative to the spacing between the reflectors 555 and 553. The end facet reflector 557 is totally internally reflective at the defined angle. A dielectric stack reflector 551 on the opposite end facet prevents establishment of a collinear Fabry-Perot mode of oscillation. Light can be extracted from the cavity by partial transmission through the multilayer reflector 535 through the laser substrate to the bottom surface 559. Electrically conductive contacts 561 may be placed on the sides of the pumped region to provide a central opening on bottom surface 559 for light transmittance. The same arrangement of contacts can be provided on the top surface, or the high reflectivity regions HR may be electrical contacts.

Figure 31:
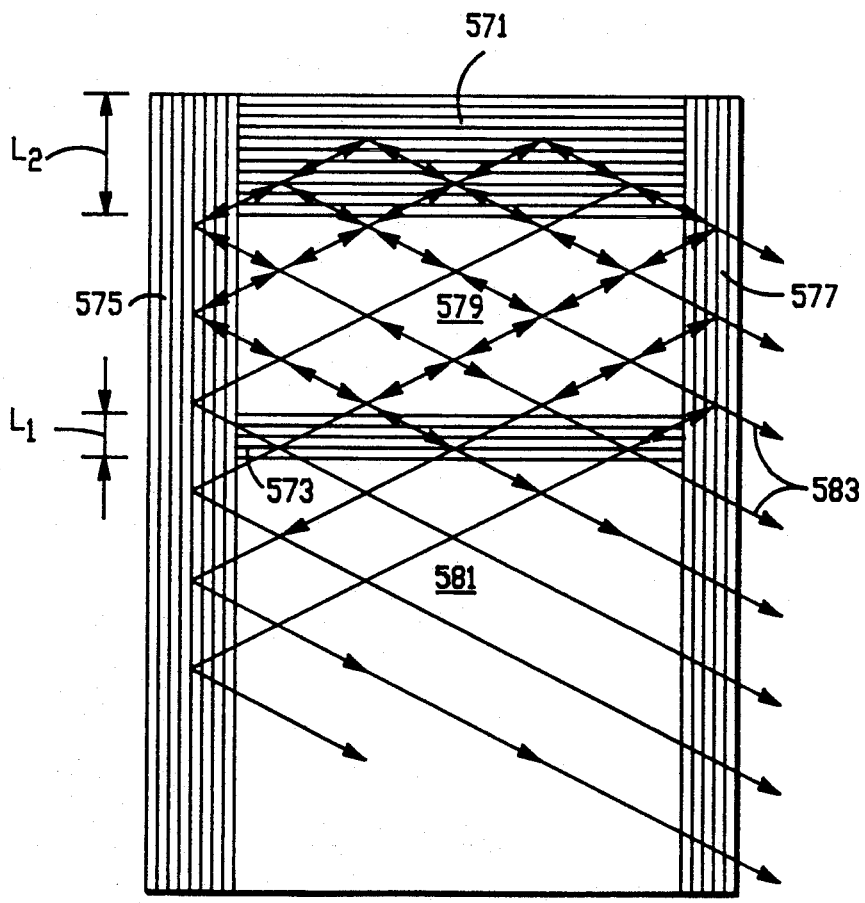
FIG. 31 is a top plan view of another ring laser embodiment of the present invention.

With reference to FIG. 31, a ring laser embodiment maximizes output coupling through one dielectric stack mirror 577. The ring cavity section 579 of the laser is defined by a high reflection grating 571, a low reflectivity grating 573 on the opposite side of the cavity section 579 from the grating 571 and two dielectric stack mirrors 575 and 577 on sides of the cavity section 579. The grating 571 has deep teeth for providing a large optical overlap, or has a large length dimension $L_2$, or both, so that grating 571 is highly reflective at the angle of incidence of the ring mode. The opposite grating 573 has shallow teeth for providing low optical overlap, or has a short length dimension $L_1$ over which the lightwaves can interact, or both, so that grating 573 has a low reflectivity (on the order of 10% or less). The left side dielectric reflector 575 should reflect nearly all (100%) of the light incident at the angle of the ring mode. The right side dielectric reflector 577 should have a reflectivity of about 20% for light incident at the angle of the ring mode. All of the reflectors should have very low reflectance for normal incidence light. Light from the ring mode passes through the low reflectivity grating 573 into a transparent section or an amplifier section 581. Light incident on the left reflector 575 is entirely reflected at an angle toward the right reflector 577. Light from the ring mode section 579 and from the transparent or amplifier section 581 that is incident at the angle of the ring mode onto the right reflector 577 is partially transmitted through the reflector 571 forming the output beam 583.

We claim:

1. A semiconductor laser structure comprising
   at least one active region for generating lightwaves,
   excitation means for pumping said at least one active region,
   at least one periodic reflector within a lasing cavity defined by said structure, said laser cavity characterized by a light path that impinges upon at least one said periodic reflector at a non-normal incidence angle such that light is laterally spread within said lasing cavity by said periodic reflector by a plurality of partial reflections over a board region of said laser structure with a width greater than 5 μm, thereby eliminating light filamentation in said lasing cavity, and
   means for determining said non-normal incidence angle for light impinging upon at least one said periodic reflector, thereby causing primarily single mode operation of said laser structure, said non-normal incidence angle determining means including at least one additional reflector outside of said lasing cavity.

2. The laser structure of claim 1 wherein said lasing cavity includes a facet reflector at one end of said broad region.

3. The laser structure of claim 1 further comprising means for applying a bias to the laser structure to modulate an effective period of at least one periodic reflector.

4. The laser structure of claim 1 further comprising an integral optical power amplifier for amplifying light from said laser cavity.

5. The laser structure of claim 1 wherein said single mode of operation of said laser structure is a ring mode.

6. The laser structure of claim 5 further comprising means for favoring one ring propagation direction over an opposite ring propagation direction.

7. A semiconductor laser comprising
a semiconductor material body having at least one light emitting active region therein,
excitation means for pumping said at least one active region, whereby lightwaves are generated and propagate under lasing conditions in the active region,
optical feedback means integral with said semiconductor material body for defining a resonant optical cavity for lightwaves propagating in said at least one active region,
grating deflection means for laterally reflecting lightwaves, incident thereon from a first portion of said resonant optical cavity, at an angle in a plane of said active region into a separate second portion of said resonant optical cavity, said first and second portions of said resonant optical cavity being non-collinear, said second portion being a broad area portion,
means, associated with at least one of said portions of said resonant optical cavity, for selecting a single spatial mode of oscillation for said lightwaves in said cavity, and
means for coupling a portion of said lightwaves out of said resonant optical cavity.

8. The laser of claim 7 wherein said means for selecting includes at least a second reflector within said resonant optical cavity in combination with a selected characteristic effective period of said grating reflection means and a selected angular orientation of sid grating reflection means with respect to at least said second reflector, such that only a single spatial mode falls within a gain band of said active region.

9. The laser of claim 7 wherein said means for selecting comprises a single transverse mode optical waveguide in said resonant optical cavity.

10. The laser cavity of claim 7 wherein said first and second portions of said resonant optical cavity are both broad area portions, said means for selecting comprising facet reflectors at ends of said broad area portions.

11. The laser of claim 7 wherein said optical feedback means includes at least one planar reflective surface at an end of one of said portions of said cavity.

12. The laser of claim 7 wherein said optical feedback means includes a reflector outside of said resonant optical cavity.

13. The laser of claim 7 further comprising means for suppressing collinear modes of oscillation to ensure laser oscillation in a noncollinear mode of oscillation.

14. The laser of claim 7 further comprising means, other than said excitation means, for applying a bias to said active region in an area associated with said grating deflection means to modulate an effective period of said grating deflection means.

15. The laser of claim 7 further comprising an integral optical power amplifier for amplifying light coupled out of said resonant optical cavity.

16. A semiconductor laser comprising
at least one active region for generating lightwaves,
excitation means for pumping said at least one active region,
reflection means for providing feedback of said lightwaves within an optical cavity, said optical cavity including a single transverse mode section and a second section that is a broad area portion which is noncollinear to said single transverse mode section, and
grating deflection means for laterally deflecting light from said single transverse mode section of said optical cavity into said noncollinear second section of said optical cavity.

17. The laser of claim 16 further comprising means for applying a bias to an area associated with said grating deflection means to modulate an effective period of said grating deflection means.

18. The laser of claim 16 wherein at least one of said single transverse mode section, said noncollinear second section and said grating deflection means has means for applying an electrical bias thereto which is independent from means for applying an electrical bias to the others of said sections and deflection means.

19. The laser of claim 16 wherein said reflection means includes at least one planar reflective surface.

20. The laser of claim 16 wherein said reflection means includes at least one grating reflector.

21. The laser of claim 16 wherein said reflection means includes a right angle reflective corner.

22. The laser of claim 16 wherein said reflection means includes both planar reflective surfaces and grating reflectors.

23. The laser of claim 16 further comprising an integral optical power amplifier for amplifying light from said optical cavity.

24. A semiconductor laser comprising
at least one active region for generating lightwaves,
excitation means for pumping said at least one active region,
first and second waveguides associated with noncollinear first and second portions of said active light emitting region to receive and guide propagation of said lightwaves along respective first and second light paths, propagation of lightwaves in said second path being in a direction at an angle to a direction of lightwave propagation in said first path,
a grating reflector formed in said semiconductor material body at ends of respective first and second waveguides so as to join said first and second waveguides, said grating reflector having an orientation and characteristic grating period that is tuned to diffract lightwaves propagating in said first waveguide into said second waveguide and to also diffract lightwaves propagating in said second waveguide into said first waveguide, and
reflectors for providing optical feedback of said lightwaves in said first and second waveguides, said reflectors defining a light path including said first and second light paths and determining an incidence angle for lightwaves in said first and second light paths impinging upon said grating reflector.

25. The laser of claim 24 wherein said reflectors providing optical feedback are reflective facets integral with said semiconductor body.

26. The laser of claim 24 wherein said reflectors providing optical feedback are distributed Bragg reflector gratings formed in said semiconductor body.

27. The laser of claim 24 wherein one of said waveguides is a narrow single transverse mode waveguide and the other of said waveguides is a broad area waveguide.

28. The laser of claim 24 wherein both of said waveguides are broad area waveguides.

29. The laser of claim 24 wherein said waveguides are oriented at right angles with respect to one another, said grating reflector being oriented for 45° light incidence and reflection relative to a normal to a direction of grating teeth of said grating reflector.

30. The laser of claim 24 wherein said waveguides are oriented at an angle other than a right angle with respect to one another, said grating reflector being oriented for light incidence and reflection at an angle, equal to half the angle separating said waveguides, relative to a direction normal to grating teeth of said grating reflector.

31. The laser of claim 24 wherein one of said reflectors providing optical feedback is a reflective right angle corner integral with said semiconductor body.

32. The laser of claim 24 further comprising second means for applying a bias to said active region in an area associated with said grating reflector to modulate said characteristic grating period thereof.

33. The laser of claim 24 further comprising an integral optical power amplifier for amplifying light coupled out of said waveguides.

34. A semiconductor laser comprising
a semiconductor material body having at least one light emitting active region therein,
excitation means for pumping said at least one active region, whereby lightwaves are generated and propagate under lasing conditions in the active region,
optical feedback means integral with said semiconductor material body for defining a resonant optical cavity that favors a single spatial mode of oscillation for lightwaves propagating in said at least one active region, said optical feedback means including a plurality of gratings in optical communication with said lightwaves, said gratings being characterized by grating periods selected in combination with incidence angles for lightwaves laterally diffracting off of said gratings in a plane of said active region and a spectral gain bandwidth of said active region, such that only one transverse mode of oscillation can operate, wherein said at least one active region includes an electrically pumped central gain region, said gratings being located outside of said central gain region, said central gain region devoid of any grating, and
means for coupling a portion of said lightwaves out of said resonant optical cavity.

35. The laser of claim 34 wherein said optical feedback means also includes at least one totally internally reflecting facet.

36. The laser of claim 34 wherein said single transverse spatial mode of oscillation being a ring mode.

37. The laser of claim 36 wherein said plurality of gratings are oriented to form orthogonal sets of gratings.

38. The laser of claim 36 wherein said ring mode is a triangle mode characterized by three propagation directions.

39. The laser of claim 36 further comprising means in said semiconductor material body for favoring one ring propagation direction over an opposite ring propagation direction.

40. The laser of claim 34 wherein at least one of said gratings is actively electrically tunable independent from the other gratings to alter the overall grating response to lightwaves in said resonant cavity, whereby the of lightwaves coupled out of said resonant cavity can be modulated by active tuning of said at least one grating.

41. The laser of claim 40 wherein said modulation is amplitude modulation.

42. The laser of claim 40 wherein said modulation is frequency modulation.

43. The laser of claim 34 further comprising an integral optical power amplifier for amplifying said lightwaves coupled out of said resonant optical cavity.

44. A semiconductor laser comprising
at least one active region for generating lightwaves,
excitation means for pumping said at least one active region,
optical feedback means integral with said semiconductor material body for defining a resonant optical cavity that favors a ring mode of oscillation for lightwaves propagating in the active light emitting region, said optical feedback means including at least one grating reflector formed in the semiconductor material body near the active light emitting region such that the grating reflector is in optical communication with propagating lightwaves, the grating reflector characterized by a grating period that is tuned to diffract only incident lightwaves generated by said active light emitting region that propagate in said ring mode, said optical feedback means also including at least two additional reflectors oriented to form a closed ring for lightwaves reflected by said grating reflector, said optical cavity being thereby defined between said grating reflector and said at least two additional reflectors,
means in said semiconductor body for favoring one ring propagation direction over an opposite ring propagation direction, and
means for coupling a portion of said lightwaves out of said resonant optical cavity.

45. The semiconductor laser of claim 44 wherein said favoring means comprises a grating reflector positioned behind said grating reflector and oriented at normal incidence to lightwaves that propagate in said opposite ring propagation direction transmitted through said grating reflector so as to preferentially reflect back said lightwaves back into said cavity in said one ring propagation direction.

46. The semiconductor laser of claim 44 wherein at least one of said additional reflectors is a facet defined on a surface of said semiconductor body.

47. The semiconductor laser of claim 44 wherein at least one of said additional reflectors is an additional grating reflector with a grating period tuned to periodically reflect nonperpendicularly incident lightwaves propagating in said ring mode.

48. The semiconductor laser of claim 44 wherein one of said additional reflectors is a refractive index boundary formed within said semiconductor body.

49. The semiconductor laser of claim 44 wherein at least two of said additional reflectors are not parallel to each other, at least one additional reflector being aligned at an angle other than perpendicular to said grating reflector.

50. The semiconductor laser of claim 44 wherein said optical feedback means includes a second grating reflector opposite the first grating reflector with a grating period tuned the same as said first grating reflector, said optical cavity being formed between said first and second grating reflectors, each of said first and second grating reflectors being actively electrically tunable independently from the other to alter the grating response to lightwaves.

51. The semiconductor laser of claim 44 wherein lightwaves propagating in said ring mode are incident upon a facet reflector at an angle less than a critical angle required for total internal reflection, whereby said coupling means comprises said facet reflector.

52. The semiconductor laser of claim 44 wherein said grating reflector is partially transmissive of said lightwaves said coupling means being dispersed behind said grating reflector.

53. The semiconductor laser of claim 52 wherein said coupling means comprises a surface emitting grating in said semiconductor body oriented with grated teeth perpendicular to a propagation direction of lightwaves transmitted through said grating reflector.

54. A semiconductor ring laser array comprising
a plurality of semiconductor ring lasers laterally spaced apart on a common substrate, each ring laser characterized by having a resonant optical cavity defined by an optical feedback mechanism that includes at least one grating reflector, said grating reflector of each ring laser having a grating period which is tuned to laterally diffract only lightwaves incident upon said grating reflector at a specified nonperpendicular angle such that said resonant optical cavity favors a ring mode of oscillation, said grating reflectors being partially transmissive, and
a plurality of second grating reflector segments disposed on said substrate in paths of lightwaves transmitted through said grating reflectors of said plurality of semiconductor ring lasers, said second grating reflector segments having the same grating period as and being aligned parallel with said grating reflectors of said ring lasers, whereby light from one ring laser incident upon a said grating reflector segment is partially reflected into an adjacent ring laser and partially transmitted through said grating reflector segment as an output light beam.

55. The laser array of claim 54 further comprising an optical amplifier between said ring lasers and said second grating reflector segments on said substrate.

56. The laser array of claim 54 further comprising means for establishing a favored direction of ring oscillation.

57. The laser array of claim 54 wherein each of said ring lasers may operate at different wavelengths.

58. The laser array of claim 54 wherein each of said ring lasers operate at a single common wavelength.

59. A semiconductor laser structure comprising
a semiconductor material body having means for providing gain to lightwaves generated within said body,
optical feedback means integral with said body, said feedback means comprising at least one periodic reflector with said lightwaves incident at non-normal angles to said reflector and having at least one reflector wherein said lightwaves are incident at normal incident angles, said periods and angles of incidence chosen relative to the gain bandwidth of the laser to produce a single transverse mode oscillation of said lightwaves over a broad lateral lasing region.

60. The laser of claim 59 wherein said periodic reflector is a grating.

61. The laser of claim 59 wherein said normal incidence reflector is a grating.

62. The laser of claim 59 wherein said normal incidence reflector is a periodic reflector.

63. The laser of claim 59 wherein said normal incidence reflector is a facet.

64. The laser of claim 59 wherein at least one portion of said body includes a single transverse mode waveguide for said lightwaves within said laser.

65. The laser of claim 59 further comprising monolithic power amplifier, whereby output from said laser is amplified.

66. The laser of claim 59 further comprising a partial reflector located in the path of a portion of said lightwaves, thereby causing unidirectional ring oscillation of said laser.

67. A semiconductor laser structure comprising
means for generating lightwaves within said structure,
optical feedback means having at least one periodic reflector, said lightwaves being incident on at least one of said periodic reflectors at non-normal incidence, at least one of said periodic reflectors having electrical bias means so as to modulate the effective period of said reflector.

68. The laser of claim 67 wherein said modulation is amplitude modulation.

69. The laser of claim 67 wherein said modulation is frequency modulation.

70. The laser of claim 67 wherein said electrical means causes said lightwave to be spatially scanned.

71. The laser of claim 67 wherein said bias means selects the transverse mode of said laser.

72. The laser of claim 67 wherein said bias means selects the frequency of said laser.

73. The laser of claim 67 wherein said bias means causes spatial scanning of said laser lightwaves.

74. The laser of claim 67 wherein at least one periodic reflector is a grating.

75. The laser of claim 67 wherein at least two periodic reflectors are disposed for laterally redirecting lightwaves within said optical cavity, said lightwaves within said optical cavity being incident upon at least one of said periodic reflectors at a nonperpendicular angle, said electrical bias means being applied to at least one of said reflectors so as to detune said at least one reflector from the other said reflector.

76. The laser of claim 75 wherein at least one of said reflectors is a grating.

77. The laser of claim 75 wherein said detuning of said at least one reflector by said bias applying means causes the intensity of lightwaves emitted from said optical cavity to be modulated.

78. The laser of claim 75 wherein said detuning of said at least one reflector by said bias applying means causes the wavelength of lightwaves emitted from said optical cavity to be modulated.

79. The laser of claim 75 wherein said detuning of said at least one reflector by said bias applying means causes the direction of lightwaves emitted from said optical cavity to change.

80. In a master oscillator power amplifier device monolithic structure having an integral optical power amplifier coupled to a semiconductor laser to receive and amplify coherent lightwaves thereform, wherein said structure includes means for lightwave generation and amplification within said laser and said amplifier and waveguide layers guiding said lightwaves within at least said laser, the improvement comprising at least one reflector being a periodic reflector in said laser, said lightwaves incident in said laser on said periodic reflector at a non-normal incidence angle, thereby causing a coherent single mode over a broad lasing region in the plane of said waveguide layers.

81. The laser of claim 80 wherein said structure includes means for modulating said laser, thereby causing modulation of an output from said amplifier.

82. The laser of claim 81 wherein said modulation is amplitude modulation.

83. The laser of claim 81 wherein said modulation is frequency modulation.

84. The laser of claim 81 wherein said modulation is a directional scanning modulation.

85. A semiconductor laser structure comprising
means for lightwave generation within said laser,
reflector means for creating a lasing cavity, said reflector means including at least one first periodic reflector, said lightwaves impinging upon said at least one first periodic reflector at a non-normal angle of incidence,
means for determining a single unique non-normal angle of incidence of said lightwaves on said periodic reflector, and
means for applying an electrical bias to said first periodic reflector to modulate the effective period thereof.

86. The laser structure of claim 85 wherein the period of said first reflector means is chosen so as to reflect a single wavelength at said single unique angle, said wavelength lying within the gain bandwidth of said laser.

87. The laser in claim 85 wherein reflection from one or more facets within said cavity determines said angle.

88. The laser structure of claim 85 wherein reflection from one or more additional periodic reflectors having a particular period and angular orientation with respect to said first periodic reflector determines said unique angle.

89. The laser structure of claim 85 wherein an angle transverse mode lateral waveguide structure within said lasing cavity determines said unique angle.

90. The laser structure of claim 85 wherein the spatial distribution of said lightwave generation means determines said unique angle.

91. The laser structure of claim 85 further comprising an integral optical power amplifier whereby said lightwaves generated within said laser are amplified.

92. The laser structure of claim 85 further comprising an output coupling grating whereby said lightwaves are output coupled from the surface of said laser.

93. The laser structure of claim 85 wherein the lasing cavity path is a ring mode.

94. The laser structure of clam 93 wherein at least one partial monolithic reflector is placed in a portion of the path of said lightwaves, thereby creating a unidirectional ring oscillation of said lightwaves in said laser cavity.

95. A semiconductor laser structure comprising
means for lightwave generation within said structure,
reflector means for said laser, said reflector means including at least two periodic reflectors, said lightwaves impinging on at least one of said periodic reflectors at non-normal incidence angles, said periodic reflectors characterized by having at least two different effective indices of refraction $n_{eff1}$ and $n_{eff2}$.

96. The laser of claim 95 wherein at least one of said effective refractive indices is electrically modulated.

97. The laser of claim 95 wherein said periodic reflectors have different periods.

98. The laser of claim 95 wherein said lightwaves impinge on at least one of said reflectors at normal incidence.

99. The laser of claim 95 wherein at least one of said reflectors is a grating.

100. The laser of claim 95 wherein at least one of said reflectors is a dielectric stack reflector.

101. The laser of claim 95 wherein at least one of said reflectors is nearly 100% reflecting.

102. The laser of claim 95 wherein one of said reflectors has an effective reflectivity below 30% and the remainder of said reflectors have reflectivities in excess of 60%.

103. The laser of claim 95 wherein at least two of said periodic reflectors are gratings, each of said gratings having a different tooth depth.

104. A semiconductor laser structure comprising
at least one active region for generating lightwaves,
excitation means for pumping said at least one active region,
optical feedback means for providing multiple non-collinear reflections from at least one planar facet, said feedback means including at least one periodic reflector, sad lightwaves impinging on said periodic reflector at an angle such that said lightwaves are spatially disperses within the plane of said waveguides, thereby avoiding optical filamentation.

* * * * *

UNITED STATES PATENT AND TRADEMARK OFFICE
CERTIFICATE OF CORRECTION

PATENT NO. : 5,231,642         Page 1 of 5
DATED      : July 27, 1993
INVENTOR(S): Donald R. Scifres et al.

It is certified that error appears in the above-indentified patent and that said Letters Patent is hereby corrected as shown below:

Column 4, line 30, "$(n_{eff}\Lambda_1$ and $n_{eff}\Lambda_2)$" should read -- $(n_{eff}\Lambda_1$ and $n_{eff}\Lambda_2)$ --.

Column 5, line 25, "mechanism" should read -- mechanisms --.

Column 5, line 26, "in laser cavity" should read -- in the laser cavity --.

Column 6, lines 21-22, "$2\Lambda \cos \theta = m\lambda_0/n_{eff}$" should read -- $2\Lambda \cos \theta = m\lambda_0/n_{eff}$ --.

Column 6, lines 27-28, "Ligh-twaves" should read -- Lightwaves --.

Column 6, lines 34-35, "ligh-twaves" should read -- lightwaves --.

Column 6, line 37, "cr" should read -- or --.

Column 7, line 13, "of the beam is as" should read -- of the beam 10 as --.

Column 7, lines 51-52; column 11, lines 50-51; column 14, lines 61-62 and column 15, lines 21-22, "ligh-twaves" should read -- lightwaves --.

Column 15, lines 15-16, "Ligh-twave" should read -- Lightwave --.

UNITED STATES PATENT AND TRADEMARK OFFICE
CERTIFICATE OF CORRECTION

PATENT NO. : 5,231,642      Page 2 of 5
DATED : July 27, 1993
INVENTOR(S) : Donald R. Scifres et al.

It is certified that error appears in the above-indentified patent and that said Letters Patent is hereby corrected as shown below:

Column 16, line 40, "periodic grating 22i" should read -- periodic grating 221 --.

Column 17, line 20, "$2\Lambda_1 \cos \theta = m_1\lambda_0/n_{eff1}$" should read -- $2\Lambda_1 \cos \theta = m_1\lambda_0/n_{eff1}$ --.

Column 17, line 21, "where $\lambda_1$ is the pitch" should read -- where $\Lambda_1$ is the pitch --.

Column 17, line 30, "$2\Lambda_2 \cos (90°- \theta) = m_2\lambda_0/n_{eff2}$" should read -- $2\Lambda_2 \cos (90°- \theta) = m_2\lambda_0/n_{eff2}$ --.

Column 18, line 18, "shoWs" should read -- shows --.

Column 19, line 1, "outside-thecavity" should read -- outside-the-cavity --.

Column 20, lines 13-14, "$2\zeta_1 \cos \theta = m_1\lambda_0/n_{eff1}$" should read -- $2\Lambda_1 \cos \theta = m_1\lambda_0/n_{eff1}$ --.

Column 20, line 21, "$2_{\Lambda 2} \cos (90°- \theta) = m_2\lambda_0/n_{eff2}$" should read -- $2\Lambda_2 \cos (90°- \theta) = m_2\lambda_0/n_{eff2}$ --.

Column 20, lines 58-59, "$2_{\Lambda 1} \cos \theta = m_1\lambda_0/n_{eff1}$ and $2\Lambda_2 \cos (90°- \theta) = m_2\lambda_0/n_{eff2}$" should read -- $2\Lambda_1 \cos \theta = m_1\lambda_0/n_{eff1}$ and $2\Lambda_2 \cos (90°- \theta) = m_2\lambda_0/n_{eff2}$ --.

UNITED STATES PATENT AND TRADEMARK OFFICE
CERTIFICATE OF CORRECTION

PATENT NO. : 5,231,642
DATED : July 27, 1993
INVENTOR(S) : Donald R. Scifres et al.

It is certified that error appears in the above-indentified patent and that said Letters Patent is hereby corrected as shown below:

Column 21, line 3, "Choosing $\lambda = 1.010$ µm" should read -- Choosing $\lambda_0 = 1.010$ µm --.

Column 22, line 32, "facets 317 a321" should read -- facets 317 and 321 --.

Column 22, lines 47-48, "ligh-twaves" should read -- lightwaves --.

Column 23, line 9, "refection" should read -- reflection --.

Column 23, line 49, "and aligner" should read -- and aligned --.

Column 24, lines 10 and 14, "board" should read -- broad --.

Column 24, line 30, "an can be" should read -- and can be --.

Column 26, lines 20-21, "$\tan \theta = (n_{eff1} \Lambda_1/m_1)/(n_{eff2}\Lambda_2/m_2)$" should read -- $\tan \theta = (n_{eff1}\Lambda_1/m_1)/(n_{eff2}\Lambda_2/m_2)$ --.

Claim 1, column 30, line 52, "board" should read -- broad --.

Claim 7, column 31, lines 20-21, "ligh-twaves" should read -- lightwaves --.

UNITED STATES PATENT AND TRADEMARK OFFICE
CERTIFICATE OF CORRECTION

PATENT NO. : 5,231,642
DATED : July 27, 1993
INVENTOR(S) : Donald R. Scifres et al.

It is certified that error appears in the above-indentified patent and that said Letters Patent is hereby corrected as shown below:

Claim 10, column 31, line 46, "The laser cavity of" should read -- The laser of --.

Claim 16, column 32, lines 3-4, and Claim 24, column 32, lines 55-56, "lightwaves" should read -- lightwaves --.

Claim 34, column 33, lines 41-42, "selected in combination" should read -- selected, in combination --.

Claim 43, column 34, lines 13-14, "lightwaves" should read -- lightwaves --.

Claim 52, column 35, lines 13-14, "lightwaves said coupling means being dispersed" should read -- lightwaves, said coupling means being disposed --.

Claim 53, column 35, line 18, "grated teeth" should read -- grating teeth --.

Claim 66, column 36, lines 18-19, "lightwaves" should read -- lightwaves --.

Claim 75, column 36, lines 45-46, "redirecting lightwaves" should read -- redirecting lightwaves --.

Claim 75, column 36, line 51, "said reflector" should read -- said reflectors --.

UNITED STATES PATENT AND TRADEMARK OFFICE
CERTIFICATE OF CORRECTION

PATENT NO. : 5,231,642
DATED : July 27, 1993
INVENTOR(S) : Donald R. Scifres et al.

It is certified that error appears in the above-indentified patent and that said Letters Patent is hereby corrected as shown below:

Claim 80, column 37, line 1, "thereform" should read - - therefrom - -.

Claim 89, column 37, line 50, "an angle" should read - - a single - -.

Claim 91, column 38, lines 2-3, and claim 95, column 38, lines 17-18, "lightwaves" should read - - lightwaves - -.

Claim 104, column 38, line 52, "are spatially disperses" should read - - are spatially dispersed - -.

Signed and Sealed this

Ninth Day of August, 1994

Attest:

BRUCE LEHMAN

Attesting Officer

Commissioner of Patents and Trademarks